United States Patent
Oakes

(10) Patent No.: US 8,078,339 B2
(45) Date of Patent: Dec. 13, 2011

(54) CIRCUIT BOARD WITH INTEGRATED CONNECTOR

(75) Inventor: Jeffrey L. Oakes, Columbus, IN (US)

(73) Assignee: Cummins Inc., Columbus, IN (US)

( * ) Notice: Subject to any disclaimer, the term of this patent is extended or adjusted under 35 U.S.C. 154(b) by 551 days.

(21) Appl. No.: 12/330,937

(22) Filed: Dec. 9, 2008

(65) Prior Publication Data

US 2009/0125184 A1 May 14, 2009

Related U.S. Application Data

(63) Continuation-in-part of application No. 11/974,644, filed on Oct. 15, 2007.

(60) Provisional application No. 60/959,345, filed on Jul. 13, 2007.

(51) Int. Cl.
*G06F 7/00* (2006.01)
(52) U.S. Cl. .......................................................... 701/1
(58) Field of Classification Search ................ 701/1, 36, 701/99
See application file for complete search history.

(56) References Cited

U.S. PATENT DOCUMENTS

| | | | |
|---|---|---|---|
| 3,339,169 A | 8/1967 | Freeland | |
| 4,015,182 A | 3/1977 | Erdman | |
| 4,192,279 A | 3/1980 | Maisch et al. | |
| 4,286,683 A | 9/1981 | Zeigner et al. | |
| 4,381,042 A | 4/1983 | Perry | |
| 4,388,692 A | 6/1983 | Jones et al. | |
| 4,393,834 A | 7/1983 | Doherty, Jr. | |
| 4,421,075 A | 12/1983 | Mandel | |
| 4,604,692 A * | 8/1986 | Murakami | 713/1 |
| 4,815,657 A | 3/1989 | Tsukuda | |
| 4,982,265 A * | 1/1991 | Watanabe et al. | 257/737 |
| 4,994,958 A | 2/1991 | Iida | |
| 5,072,703 A | 12/1991 | Sutton | |
| 5,198,888 A * | 3/1993 | Sugano et al. | 257/686 |
| 5,222,469 A | 6/1993 | Sutton | |
| 5,229,922 A | 7/1993 | Muramatsu et al. | |
| 5,317,998 A | 6/1994 | Hanson | |
| 5,363,904 A | 11/1994 | Pierret et al. | |
| 5,429,488 A | 7/1995 | Neu | |
| 5,434,749 A | 7/1995 | Nakayama | |
| 5,495,887 A | 3/1996 | Kathnelson et al. | |
| 5,497,941 A | 3/1996 | Numazawa et al. | |
| 5,526,951 A * | 6/1996 | Bailey et al. | 216/24 |

(Continued)

FOREIGN PATENT DOCUMENTS

EP 1 079 982 3/2001

(Continued)

OTHER PUBLICATIONS

Stodolsky, F., Gaines, L., Vyas, A. "Analysis of Technology Options to Reduce the Fuel Consumption of Idling Trucks." Center for Transportation Research Argonne Nat. Lab. 2000.

(Continued)

*Primary Examiner* — Paul N Dickson
*Assistant Examiner* — Laura Freedman
(74) *Attorney, Agent, or Firm* — Matthew D. Fair; L. Scott Paynter; Krieg DeVault LLP

(57) ABSTRACT

Removable circuits and related mounting hardware for removably connecting circuits to a vehicle's control system. Circuits and connectors form an addressable assembly which may be enclosed in a flowable material.

27 Claims, 11 Drawing Sheets

U.S. PATENT DOCUMENTS

| | | | |
|---|---|---|---|
| 5,588,202 A | 12/1996 | Ehlers et al. | |
| 5,623,835 A | 4/1997 | Layman et al. | |
| 5,644,924 A | 7/1997 | Carr et al. | |
| 5,720,176 A | 2/1998 | Manson et al. | |
| 5,732,676 A | 3/1998 | Weisman et al. | |
| 5,901,572 A | 5/1999 | Peiffer et al. | |
| 5,901,780 A | 5/1999 | Zeigler et al. | |
| 5,967,858 A | 10/1999 | Yamada | |
| 5,982,611 A | 11/1999 | Campbell et al. | |
| 5,995,379 A * | 11/1999 | Kyougoku et al. | 361/803 |
| 6,038,877 A | 3/2000 | Peiffer et al. | |
| 6,125,309 A * | 9/2000 | Fujimoto | 701/1 |
| 6,276,161 B1 | 8/2001 | Peiffer et al. | |
| 6,351,703 B1 | 2/2002 | Avery, Jr. | |
| 6,457,324 B2 | 10/2002 | Zeigler et al. | |
| 6,626,003 B1 | 9/2003 | Kortum et al. | |
| 6,651,895 B1 | 11/2003 | Kadle et al. | |
| 6,681,588 B2 | 1/2004 | Zeigler | |
| 6,700,195 B1 | 3/2004 | Mandel | |
| 6,712,133 B1 | 3/2004 | Kyrtsos et al. | |
| 6,745,585 B2 | 6/2004 | Kelm et al. | |
| 6,748,651 B2 | 6/2004 | Miyajima et al. | |
| 6,768,221 B2 | 7/2004 | Klinger et al. | |
| 6,889,762 B2 | 5/2005 | Zeigler et al. | |
| 6,905,349 B1 | 6/2005 | Brandenburg et al. | |
| 6,935,020 B2 | 8/2005 | Ikeda | |
| 6,968,707 B2 | 11/2005 | Violand et al. | |
| 6,969,183 B2 * | 11/2005 | Okubo et al. | 362/466 |
| 7,027,912 B1 | 4/2006 | Metzger | |
| 7,029,787 B2 | 4/2006 | Bando et al. | |
| 7,043,931 B2 | 5/2006 | Plummer | |
| 7,180,745 B2 | 2/2007 | Mandel et al. | |
| 7,181,414 B1 * | 2/2007 | Ogawa et al. | 705/13 |
| 7,230,829 B2 | 6/2007 | Mandel et al. | |
| 7,233,311 B2 * | 6/2007 | Okubo et al. | 345/108 |
| 7,234,312 B2 | 6/2007 | Violand et al. | |
| 7,260,454 B2 * | 8/2007 | Pickering et al. | 701/2 |
| 7,262,455 B2 * | 8/2007 | Tanaka et al. | 257/315 |
| 7,347,175 B2 | 3/2008 | Lupo et al. | |
| 7,352,585 B2 | 4/2008 | Mandel et al. | |
| 7,416,011 B2 | 8/2008 | Mandel et al. | |
| 7,448,227 B2 | 11/2008 | Zeigler et al. | |
| 7,454,922 B2 | 11/2008 | Zeigler et al. | |
| 7,509,206 B2 * | 3/2009 | Sakurai et al. | 701/99 |
| 7,542,826 B2 * | 6/2009 | Hanzawa | 701/1 |
| 7,591,143 B2 | 9/2009 | Zeigler et al. | |
| 7,591,303 B2 | 9/2009 | Zeigler et al. | |
| 7,797,958 B2 | 9/2010 | Alston et al. | |
| 7,952,184 B2 * | 5/2011 | Farrar et al. | 257/687 |
| 2002/0067638 A1 * | 6/2002 | Kobayashi et al. | 365/185.01 |
| 2002/0109011 A1 | 8/2002 | Fleckenstein | |
| 2002/0141233 A1 * | 10/2002 | Hosotani et al. | 365/158 |
| 2003/0095688 A1 | 5/2003 | Kirmuss | |
| 2003/0106332 A1 | 6/2003 | Okamoto et al. | |
| 2004/0000892 A1 | 1/2004 | Jae-Sueng | |
| 2004/0007403 A1 | 1/2004 | Tomatsuri | |
| 2004/0122563 A1 * | 6/2004 | Okada et al. | 701/1 |
| 2004/0193340 A1 * | 9/2004 | Katou | 701/29 |
| 2005/0115258 A1 | 6/2005 | Violand et al. | |
| 2005/0178132 A1 | 8/2005 | Sakaguchi et al. | |
| 2006/0064996 A1 | 3/2006 | Violand et al. | |
| 2006/0186214 A1 | 8/2006 | Simon et al. | |
| 2006/0196953 A1 | 9/2006 | Simon et al. | |
| 2006/0235577 A1 * | 10/2006 | Ikeda et al. | 701/1 |
| 2007/0017666 A1 | 1/2007 | Goenka et al. | |
| 2007/0120663 A1 | 5/2007 | Roewer | |
| 2007/0131408 A1 | 6/2007 | Zeigler et al. | |
| 2007/0194139 A1 | 8/2007 | Beggs | |
| 2008/0196436 A1 | 8/2008 | Connell et al. | |
| 2008/0196877 A1 | 8/2008 | Zeigler et al. | |
| 2008/0256475 A1 | 10/2008 | Amundson et al. | |
| 2009/0000778 A1 | 1/2009 | Nathan | |
| 2009/0015203 A1 | 1/2009 | Oakes | |
| 2009/0016042 A1 | 1/2009 | Oakes | |
| 2009/0017643 A1 | 1/2009 | Oakes | |
| 2009/0017986 A1 | 1/2009 | Oakes | |
| 2009/0018702 A1 | 1/2009 | Oakes | |
| 2009/0018707 A1 | 1/2009 | Oakes | |
| 2009/0018719 A1 | 1/2009 | Oakes | |
| 2009/0158758 A1 | 6/2009 | Eguchi | |
| 2009/0301702 A1 | 12/2009 | Zeigler et al. | |

FOREIGN PATENT DOCUMENTS

| | | |
|---|---|---|
| EP | 1 362 723 | 11/2003 |
| EP | 1 961 596 | 8/2008 |
| EP | 1 961 599 | 8/2008 |
| EP | 1 985 481 | 10/2008 |
| EP | 1 504 227 | 5/2010 |
| WO | WO 99/61269 | 12/1999 |
| WO | WO 99/61271 | 12/1999 |
| WO | WO 02/103267 | 12/2002 |
| WO | WO 03/093737 | 11/2003 |
| WO | WO 2009/011809 | 1/2009 |

OTHER PUBLICATIONS

U.S. Appl. No. 11/974,658, Jeffery Oakes, filed Oct. 15, 2007, Office Action dated Aug. 19, 2009.
U.S. Appl. No. 11/974,645, Jeffery Oakes, filed Oct. 15, 2007, Office Action dated Apr. 28, 2009.
U.S. Appl. No. 11/974,645, Jeffery Oakes, filed Oct. 15, 2007, Notice of Allowance dated Nov. 13, 2009.
U.S. Appl. No. 11/974,641, Jeffery Oakes, filed Oct. 15, 2007, Office Action dated Dec. 29, 2009.
U.S. Appl. No. 11/974,658, Jeffery Oakes, filed Oct. 15, 2007, Office Action dated Feb. 2, 2011.
U.S. Appl. No. 11/974,640, Jeffery Oakes, filed Oct. 15, 2007, Final Office Action dated Feb. 24, 2011.
U.S. Appl. No. 11/974,641, Jeffery Oakes, filed Oct. 15, 2007, Final Office Action dated Dec. 7, 2010.
U.S. Appl. No. 11/974,643, Jeffery Oakes, filed Oct. 15, 2007, Notice of Allowance dated Feb. 8, 2011.
U.S. Appl. No. 11/974,645, Jeffery Oakes, filed Oct. 15, 2007, Corrected Notice of Allowance dated Feb. 3, 2011.

* cited by examiner

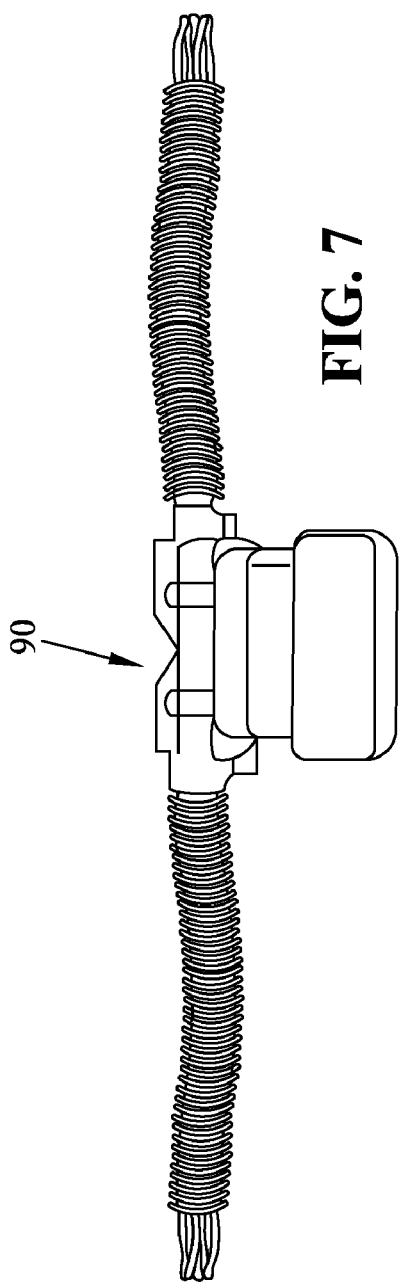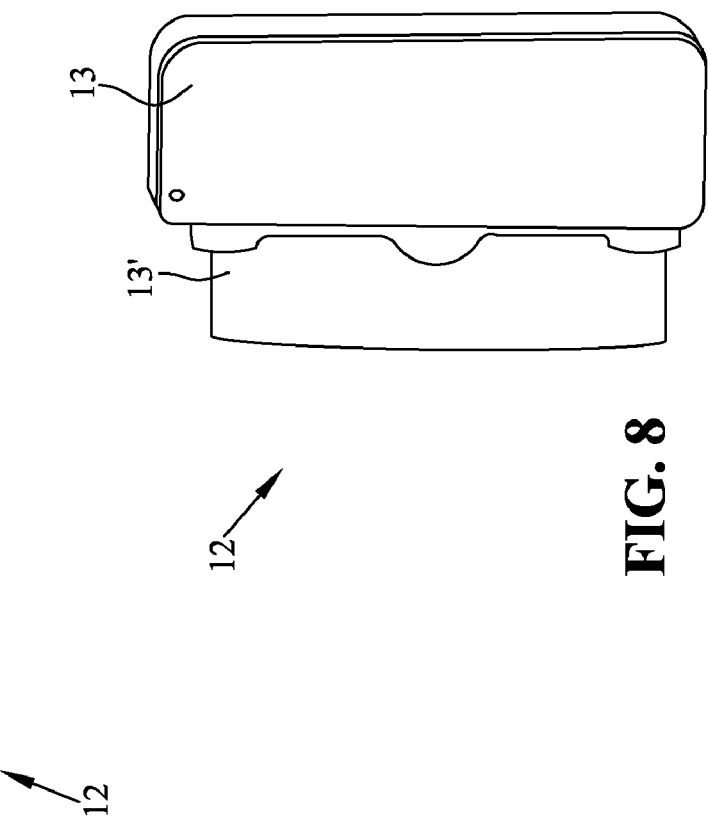

SECTION A-A

CIRCUIT BOARD WITH INTEGRATED CONNECTOR

CROSS-REFERENCE TO RELATED APPLICATIONS

The present application claims priority to and is a continuation-in-part of U.S. patent application Ser. No. 11/974,644, filed Oct. 15, 2007, which claims the benefit of U.S. Provisional Patent Application 60/959,345 titled "IDLE CONTROL SYSTEM AND METHOD OF MOUNTING," filed Jul. 13, 2007, and the entire disclosure of each application is expressly incorporated by reference herein.

The present application is related to U.S. patent application Ser. Nos. 11/974,640, 11/974,641, 11/974,642, 11/974,643, 11/974,645, and 11/974,648, filed Oct. 15, 2007.

FIELD OF THE APPLICATION

The present disclosure generally relates to vehicle control circuits, and more particularly to integrated removable assemblies and related mounting hardware for removably connecting circuits to a vehicle's control system.

BACKGROUND

Internal combustion engines generate emissions that are undesirable for a variety of reasons. It is well known that waste products in engine exhaust such as carbon monoxide, hydrocarbons, and nitrogen oxides adversely affect human health, and present risks to the environment. Diesel engines in particular produce considerable amounts of soot, which contains particulate matter, black carbon, sulfur dioxide, nitrogen oxides and other hazardous pollutants. Several government agencies regulate emissions of such material.

Increases in engine running time produce increases in waste products and fuel consumption. Operators of Semitractor trailers often have sleeping quarters located within the cab to allow sleeping or other activity when the truck is parked and the operator is not driving. Operators often leave the engine running when so parked so that he/she may utilize the climate control features of the cab and to allow powering of auxiliary devices without unacceptable depletion of the battery of the truck's electrical system. Accordingly, the engine of the truck is operated when the truck is not traveling, thereby producing waste products and consuming fuel through idling.

Circuit boards with electronic circuits may be provided with processing instructions to control the operation of the engine of a parked vehicle. The circuit boards may be removably coupled to the electric harness of a vehicle to enable after-market adaptation of a vehicle's control system.

SUMMARY

An integrated electronic assembly and methods of using the assembly are disclosed herein. In one embodiment, a method of integrating an addressable assembly in a vehicle is disclosed. The method comprises providing a first control unit to control a function of the vehicle and providing an addressable assembly. The addressable assembly includes a substrate and a plurality of conductive traces disposed on the substrate. The assembly also includes a plurality of connectors extending from a first surface of the substrate. The connectors are connected to the conductive traces. The connectors receive a first plurality of signals including an identification address. The assembly also includes a memory, a processing sequence stored in the memory, and a second control unit operably coupled to the memory and to the conductive traces. The second control unit is operable to produce a second plurality of signals responsive to the first plurality of signals according to the processing sequence. A housing encloses the substrate and the second control unit. The method further includes electronically and removably coupling the addressable assembly to the first control unit. The first control unit performs the function responsive to the second plurality of signals.

In another embodiment, a method of using an addressable assembly in a vehicle is disclosed. The vehicle includes a communication network and a device. The method comprises providing an addressable assembly, electronically and removably coupling the addressable assembly to the communication network. The addressable assembly includes a substrate and a plurality of conductive traces disposed on the substrate. The assembly also includes a plurality of connectors extending from a first surface of the substrate. The connectors are connected to the conductive traces. The connectors receive a first plurality of signals including an identification address. The assembly also includes a memory, a processing sequence stored in the memory, and a processing unit operably coupled to the memory and to the conductive traces. The processing unit is operable to produce a second plurality of signals responsive to the first plurality of signals based on the processing sequence. A housing comprising a flowable material encloses the substrate and the processing unit. The housing and the substrate support the connectors. The method further includes the step of causing the device to perform a function based on the second plurality of signals.

In another embodiment, an addressable assembly adapted for coupling to a vehicle is disclosed. The assembly comprises a substrate and a plurality of conductive traces disposed on the substrate. The assembly also includes a plurality of connectors extending from a first surface of the substrate. The connectors are connected to the conductive traces. The connectors receive a first plurality of signals including an identification address. The assembly also includes a memory, a processing sequence stored in the memory, and a processing unit operably coupled to the memory and to the conductive traces. The processing unit is operable to produce a second plurality of signals responsive to the first plurality of signals based on the processing sequence. The assembly further comprises a housing comprising a flowable material which encloses the substrate and the processing unit. The housing and the substrate support the connectors.

BRIEF DESCRIPTION OF THE FIGURES

FIG. 7 is a perspective view of a wire harness and CEMS control unit that are part of the hardware configuration of FIG. 1;

FIG. 8 is a perspective view of the CEMS control unit of FIG. 7;

The above mentioned and other features of this disclosure, and the manner of attaining them, will become more apparent and the disclosure itself will be better understood by reference to the following description of embodiments of the disclosure taken in conjunction with the accompanying drawings.

DETAILED DESCRIPTION

The embodiments disclosed below are not intended to be exhaustive or to limit the disclosure to the precise forms disclosed in the following detailed description. Rather, the embodiments are chosen and described so that others skilled in the art may utilize their teachings.

Figure 1:
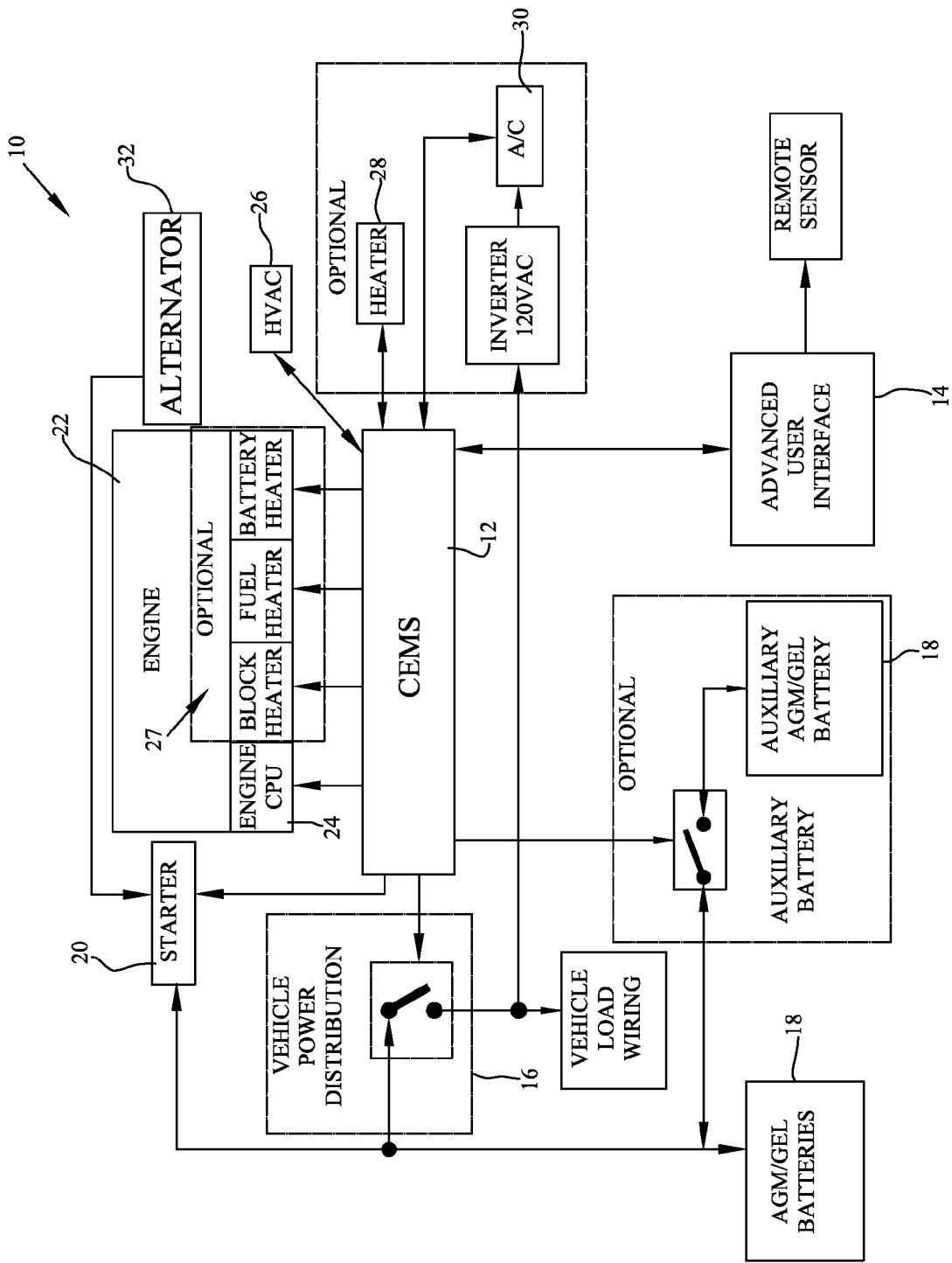
FIG. 1 is a conceptual block diagram of a hardware configuration for the present disclosure.

FIG. 1 depicts a hardware configuration for use with one embodiment according to the present disclosure. As shown, idle control system 10 includes a central "CEMS" control unit 12 that provides hardware and software for performing many of the functions described herein. Control unit 12 is connected to a monitor/interface 14 for providing information to a driver and, optionally, obtaining driver inputs. Control unit 12 is relatively small and lightweight. Control unit 12 approximately 137 cm$^3$ in volume and is mounted via a wire harness 90 (FIG. 7) for a combined volume of approximately 266 cm$^3$. Being small, lightweight, and mountable via wire harness 90 allows control unit 12 to be mounted in a wide variety of locations on the vehicle (within the engine compartment, under the dash, etc). Furthermore, the design allows easy placement of control unit 12 in vehicles that were not initially manufactured with system 10 in mind, i.e. retrofits.

Control units may comprise any number of CPU architectures well known in the art. Exemplary control units include ARM7 RISC controllers available from STMicroelectronics, 39 Chemin du Champ des Filles, C. P. 21, CH 1228 Plan-Les-Ouates, Geneva, Switzerland under trade name model STR710FZ2H7 and STR730FZ2H7. Controllers may be packaged in quad flat pack (QFP) and ball grid array (BGA) architectures including fine pitched BGA which enables considerable size and weight reduction as compared to the standard BGA architecture. The controllers may be programmed to comply with SAE standard J1939 which addresses practices intended for light, medium, and heavy duty vehicles and their trailers, used on or off road, as well as appropriate stationary applications which use vehicle derived components (e.g. generator sets). Other vehicles of interest include, but are not limited to construction equipment and agricultural equipment and implements. Controllers may include J1939 compliant communication controllers or such communication controllers may be provided separately. Other communication protocols may be used such as RS-232, RS-485, USB, parallel communication protocols, and hardwired handshake based methods.

One or more control units and other electronic devices may communicate over a standard controller-area network (CAN or CAN-bus) directly with or without a host computer. CAN is a broadcast serial bus standard for connecting electronic control units (ECUs). In addition to idle control unit 12, ECUs may be used for transmission, airbags, antilock braking, cruise control, audio systems, windows, mirror adjustment, catalytic converters, vision systems, door locks, climate control, seat control and other vehicle subsystems. Monitor/interface 14 may also comprise an ECU for receiving and outputting information over the CAN-bus. Some of these form independent subsystems. A subsystem may need to control actuators or receive feedback from sensors. Each ECU communicates with a CAN controller which sends and receives messages consisting primarily of an ECU identifier and up to eight message bytes. The CAN controller may incorporate signal conditioning circuits. An exemplary CAN controller is the Intel 82527 serial communication controller manufactured by Intel Corporation. The CAN data link layer protocol is standardized in ISO 11898-1 (2003). An ECU may incorporate a communications controller and may be programmed with an identification address. When the ECU, directly or through a serial communications controller, CAN or otherwise, receives first data inputs including the identification address, the ECU outputs a second data including information which another ECU may utilize to control a function of the vehicle.

As shown in FIG. 7, control unit 12 comprises body 13 and shroud 13'. Shroud 13' includes a plurality of connectors, which may be pins or sockets. Control unit 12 is adapted for removable coupling to harness 90 or to a compatible connection unit, a plug or receptacle, mounted on firmly on the vehicle. A removable ECU connectable to a harness enables adaptive configuration of a vehicle's controls and distribution of ECUs to alleviate congestion in the limited space provided in a vehicle's firewall or in the engine compartment. Additionally, harness support provides vibration isolation and enables placement of ECUs in locations where the ECU might be protected from the external environment. Body 13 includes a substrate, such as a printed circuit board, having a plurality of through-holes adapted to support a plurality of integrated circuit components and external connectors (not shown). The plurality of connectors of shroud 13' are supported by the material forming the shroud and are, in a separate manufacturing step, connected to the substrate, e.g. soldered. Soldering couples shroud 13' to the substrate. Subsequently, body 13 is encapsulated with a material adapted to protect the substrate and the components from dirt and moisture. Encapsulating materials include ceramics and polymers and suitable hardeners, catalysts and fillers. Polymers include thermoset, e.g. epoxy, and thermoplastic, e.g. polyolefins, nylon, urethane, polymers. Exemplary polymer compositions include glass filled nylon and calcium carbonate filled epoxy. Fillers may be use to improve thermal conductivity and heat extraction when the electronic component comprising body 13 and shroud 13' is functioning.

During the encapsulation process, flowable material surrounds body 13 and portions of shroud 13' to form a joint with shroud 13' so that moisture and dirt may not penetrate between shroud 13' and the encapsulating material to reach the printed circuit board or the components. The encapsulating material of shroud 13' may be injection molded around the connectors which are, generally, not thermally sensitive, may be temporarily supported by a mold which may function as a heat sink, and thus can withstand injection molding temperatures. Encapsulation methods include overmolding, potting, casting, dipping, deposition and the like, alone or in combination. For example, a thin insulating layer may be produced by deposition followed by casting of a more durable and protective layer. Exemplary encapsulating equipment and methods are described in U.S. Pat. No. 5,429,488 issued Jul. 4, 1995 which is incorporated herein by reference in its entirety. Alternative embodiments of control units and methods of manufacturing control units are described below with reference to FIGS. 10-12.

Control unit 12 may control the vehicle's starter 20 to start and stop engine 22 in the manner described below. Control unit 12 may be also connected to LVD 16 (low voltage disconnect) switch which, under certain circumstances described below, may be used to disconnect the vehicle's electrical loads from batteries 18. Alternatively, control unit 12 may be directly connected to an optional inverter which may be connected to the auxiliary batteries. Control unit 12 may control operation of the inverter to charge the batteries. In a further alternative, a direct-current powered heater and air conditioning unit may be utilized, and an inverter is not required. The direct-current powered heater and air conditioning unit may be electrically coupled for control by control unit 12. Batteries 18 may be absorbed glass mat (AGM), deep cycle, or other types of batteries. Multiple batteries 18 may be used in combination to provide longer battery operation an to obtain more energy from batteries 18. This increase in energy allows engine 22 to achieve longer periods of deactivation, and thus increased fuel savings and decreased emissions. Battery 18 will often be discussed herein as a singular battery, however, it should be appreciated that multiple combined batteries 18 are also envisioned.

LVD 16 works to provide a "parked" state operation. Parked state provides full power disconnect of battery 18 from loads upon detection of stored energy in battery 18 that falls below a calculated threshold. One such threshold may be set to ensure that enough energy is maintained in battery 18 to start engine 22. Avoiding full battery discharge (such as after long-term vehicle parking (e.g. vacation)) eliminates needing jump starts. System 10 measures energy supplied to battery 18 during engine 22 operation and energy delivered by battery 18 when engine 22 is off to determine stored battery energy. Alternatively, system 10 may be configured to automatically start engine 22 to charge battery 18 when stored battery energy falls below the threshold.

System 10 also includes a "run" state. During vehicle operation at driving speeds, system 10 monitors energy provided to battery 18 as a way of monitoring proper alternator 32 operation. During this state, system 10 may be configured to turn fans of heating and cooling elements 26, 28, 30 on and off to properly heat/cool the cab while the operator is driving. Controlling the fan of cooling elements 26, 60 can reduce parasitic load on engine 22 and therefore, improve fuel efficiency.

Idle control system 10 includes communications with the vehicle's engine control unit "ECU" 24 to obtain a variety of information, including a speed signal, upon which idle control system 10 bases its idle speed determinations. These communication are over a common truck datalink (J1939) used with electronically controlled engines. Speed determinations are made to achieve the ideal engine idle speed by considering the desire to reduce fuel consumption, alternator output considerations, and block temperature or HVAC considerations.

In a "base" embodiment, idle control system 10 uses the vehicle's heating and air conditioning system 26 to control the interior temperature of the vehicle. The base embodiment requires that engine 22 be operating whenever the heating and air conditioning system 26 is needed to change the interior temperature. In an "expanded" embodiment, which can be operated on battery 18 power alone, idle control system 10 uses one or more auxiliary devices 28, 30 to heat and cool the vehicle, either exclusively or in conjunction with the vehicle's heating and air conditioning system 26.

The expanded embodiment utilizes the modular design of system 10. The expanded embodiment provides for various components to be added to the system to achieve higher efficiencies, but are not required for the system to operate. Control unit 12 is automatically re-configured to control an accessory, such as a fuel fired heater 28 and an A/C device 30, upon connection of the accessory to control unit 12. These accessories or auxiliary devices 28, 30 are optionally run off of battery power instead of receiving power when the vehicle idles. Accordingly, control unit 12 may control interior temperature without requiring engine operation, thereby decreasing fuel consumption and emissions. Additionally, accessories 28, 30 may be used in conjunction with heating and air conditioning system 26 of the vehicle. If control unit 12 is unable to cool or heat to the required temperature by using accessories 28, 30 then control unit 12 will also start the engine and use the vehicles heating and air conditioning system 26 to augment the accessory equipment 28, 30 in heating and cooling the vehicle. Heating and air conditioning system 26 may include a fuel fired block heater 27 using battery 18 power to activate when oil temperature in engine 22 is too low.

The heating and cooling functions of idle control system 10 (all embodiments) are controlled by an algorithm. The operator does not need to select a "heating state" or a "cooling state" in control unit 12. In the base embodiment, the driver manually sets the heating or cooling controls on the vehicle's heating and air conditioning system 26 (e.g., turn the air conditioner to high so that when idle control system 10 starts the vehicle, the air conditioner will be on). Idle control system 10 starts and stops engine 22 to maintain the desired temperature in the vehicle. In the expanded implementation, the driver simply activates idle control system 10, selects or sets a desired interior temperature via monitor 14 or otherwise, and idle control system 10 determines, based on the current interior temperature, whether to heat or cool the vehicle. In some embodiments, the driver is restricted to choose a desired temperature between 65° F. and 75° F. As indicated above, the heating and cooling may be performed using auxiliary devices 28, 30 powered by batteries 18, or a combination of auxiliary devices 28, 30 and the vehicle's heating and air conditioning system 26.

In either implementation, idle control system 10 periodically starts and stops the vehicle's engine 22, either to reach a desired interior temperature, or to charge the vehicle's batteries 18 as described below. This starting and stopping is performed without regard to the position of the vehicle's ignition switch. When the driver deactivates idle control system 10, however, control of engine 22 (i.e., starting and stopping) is immediately returned to the ignition switch.

The following example illustrates the normal operation of the heating and cooling functions of idle control system 10. This example assumes a base embodiment of idle control system 10 (i.e., without auxiliary heating or cooling devices), an outside temperature of 90 degrees, and an initial interior temperature of 80 degrees. After parking the vehicle and activating idle control system 10, the driver uses the vehicle's monitor 14 in bunk area 17 to select a desired temperature of 70 degrees. Additionally, to lower the temperature in the bunk area, the driver turns the vehicle's air conditioning switch to the on position. As the current temperature is higher than the desired temperature, idle control system 10 determines that it must turn on the vehicle's engine 22 to operate the air conditioning system. Idle control system 10 then continuously monitors the current temperature in the vehicle.

Idle control system 10 operates the vehicle's cooling system 26 until the measured interior temperature reaches a deactivation threshold, which is the desired temperature minus two degrees. It should be appreciated that while thresholds are discussed herein as various values, such as "desired temperature minus two degrees," other values may be used and such values may be functions of other settings. Idle control system 10 reactivates cooling system 26 when the interior temperature rises to an activation threshold, which is the desired temperature plus four degrees. When heating the interior of the vehicle, idle control system 10 similarly drives the interior temperature to a deactivation threshold (the desired temperature plus two degrees), and reactivates heating system 26 when the interior temperature cools to an activation threshold (the desired temperature minus four degrees). The relationships between the thresholds and the desired temperature cannot be adjusted by the driver.

Figure 2:
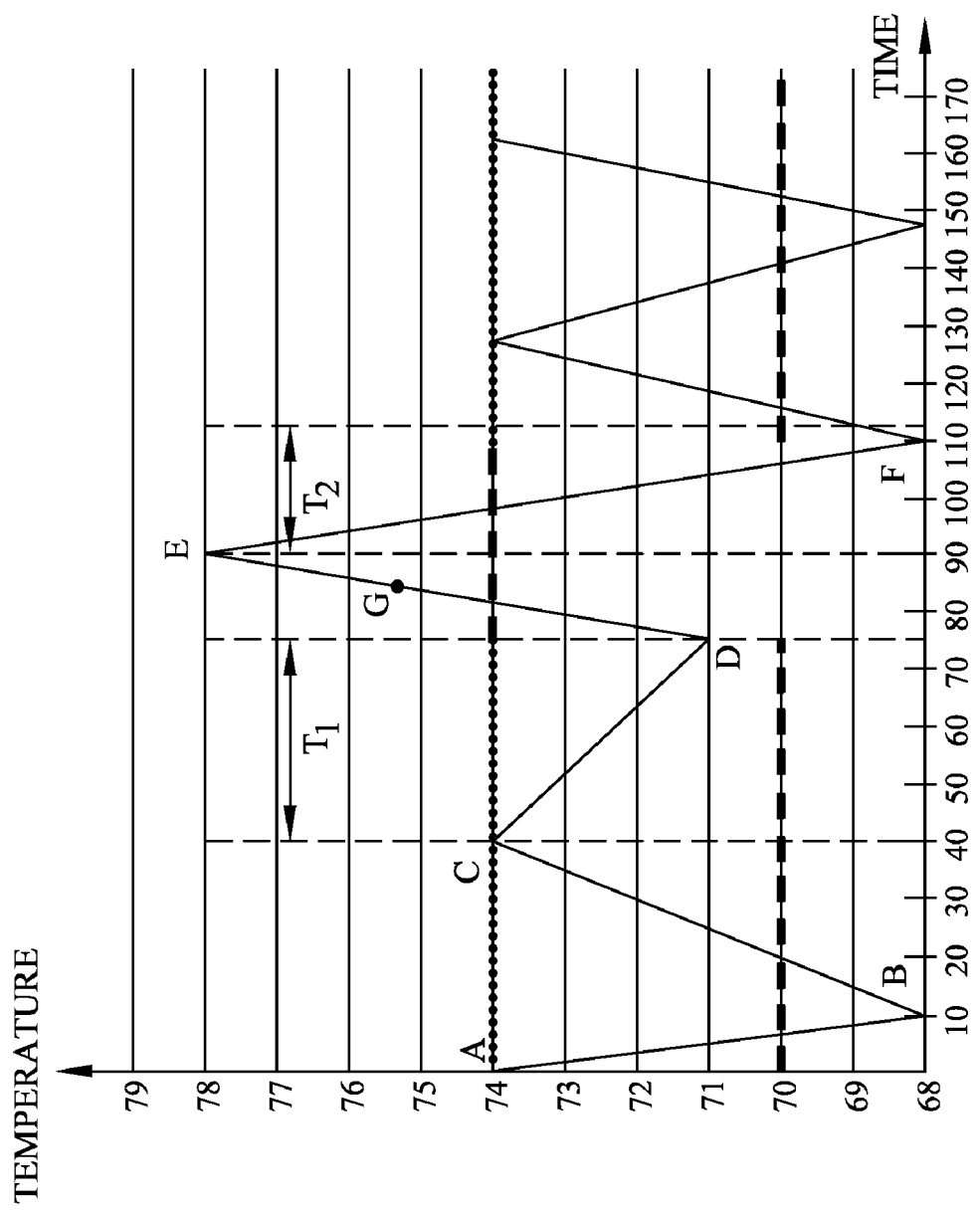
FIG. 2 is graph of temperature fluctuations within the cab of a vehicle utilizing the hardware configuration of FIG. 1.

Continuing with the example and referring to FIG. 2, when the measured interior temperature is cooled from the initial temperature of 80 degrees, through the activation threshold of 74 degrees (point A), through the desired temperature of 70 degrees, to the deactivation threshold of 68 degrees (point B), engine 22 is typically turned off, thereby deactivating cooling system 26.

As is further described below, even when the deactivation threshold is reached, idle control system 10 may cause engine 22 to continue running if further operation of alternator 32 is needed to charge batteries 18. In that situation, idle control system 10 turns off the fans for the vehicle's cooling system 26 when the deactivation threshold is reached, which deactivates the vehicle's compressor.

When cooling system 26 is deactivated, the measured temperature of the interior of the vehicle will slowly rise as the warmer, outside air transfers heat through the vehicle. As shown in FIG. 2, the interior temperature eventually reaches the activation threshold (point C) of 74 degrees (the desired temperature plus four degrees). When the measured temperature reaches the activation threshold, idle control system 10 again turns on the vehicle's engine 22 to operate cooling system 26 and drive the interior temperature back down to the deactivation threshold of 68 degrees (not shown in FIG. 2). This cycling continues as necessary. By turning engine 22 on only as needed to achieve a desired interior temperature, idle control system 10 saves fuel and reduces emissions as compared to full time idling.

In some embodiments of idle control system 10, control unit 12 may, based on data reflecting the historical operation of system 10, determine or estimate the approximate sleep time of the driver. For example, if idle control system 10 has been regularly activated between the hours of 10:00 p.m. and 6:00 a.m., control unit 12 may assume that the driver sleeps during this time. To further improve overall vehicle energy management, idle control system 10 may be configured to automatically adjust the desired temperature as the driver sleeps. For example, if the driver selects a desired temperature of 70 degrees, control unit 12 may operate in the manner described above until midnight, when it automatically changes the effective desired temperature to 74 degrees. The automated changing of the effective desired temperature results in a virtual set point. It is virtual in that it was not actually set by the user, but the system is treating the set point as if it was selected by the user. This small difference in desired temperature, the four degrees between the set temperature and the virtual set point, should go unnoticed by the sleeping driver, and will further reduce fuel consumption and emissions by decreasing the engine 22 on time.

Under some circumstances, idle control system 10 will not be capable of achieving the deactivation threshold temperature. For example, the vehicle's temperature control systems may perform badly as a result of clogged filters or depleted refrigerant, or the outside temperature may be so extreme that even a fully functional temperature control system could not achieve the deactivation threshold temperature. Alternatively, the driver may have inadvertently or intentionally left a window opened. It is known that some drivers are irritated by or have difficulty sleeping as a result of periodic engine 22 starts and stops. Some of these drivers have attempted to circumvent the operation of idle control systems 10 by opening a window and setting a desired interior temperature that cannot be reached with the incoming outside air. Some idle control systems 10 will run engine 22 continuously in an attempt to achieve the desired temperature, thereby eliminating the fuel and emission reduction of the system. Idle control system 10 prevents this loss of efficiency, regardless of the cause (i.e., equipment problems or driver carelessness/manipulation) by automatically resetting the desired temperature to a virtual set point in the manner described below.

Idle control system 10 automatically adjusts the desired temperature if the deactivation threshold associated with the current desired temperature is not reached within a predetermined amount of time ("the allotted time"). Idle control system 10 computes the allotted time upon reaching the activation threshold. By employing a signal from the ECU representing the outside air temperature, the idle control system 10 determines the difference between the outside temperature and the desired temperature ("the temperature differential or TD"). The idle control system 10 then determines whether TD is positive or negative to automatically determine whether to heat or cool. A negative TD indicates a heat mode and a positive TD indicates a cooling mode. A table stored in memory associates TD ranges with an expected rate of inside temperature change ("the expected rate") in terms of minutes per degree Fahrenheit. Table 1 depicts this expected rate look-up table.

TABLE 1

|  | Expected Rate |
|---|---|
| Negative TD | |
| TD > 70 | 10 |
| 50 < TD ≦ 70 | 8 |
| 30 < TD ≦ 50 | 6 |
| 0 ≦ TD ≦ 30 | 4 |
| Positive TD | |
| TD > 35 | 10 |
| 25 < TD ≦ 35 | 8 |
| 15 < TD ≦ 25 | 6 |
| 0 ≦ TD ≦ 15 | 4 |

Using the example depicted in FIG. 2, at point C the idle control system 10 computes TD (i.e., 92−70=+22, where 92 is the outside temperature and 70 is the desired temperature), and accesses the look-up table to determine an expected rate of change of 6 minutes per degree. Thus, the idle control system 10 determines an allotted time of 36 minutes to reach the deactivation threshold of 68 degrees. It should be noted that the expected rate is checked each time the inside temperature changes one degree. In other words, when the inside temperature reaches 73 degrees, the idle control system 10 will again compute TD (i.e., 92−70=+22, the outside temperature has not changed), and ascertain the expected rate (i.e., 6 minutes per degree) for the remainder of the cycle. Next, the idle control system 10 computes the remaining allotted time based on this expected rate. As such, the originally calculated allotted time may change during the cycle if TD falls into a different range of Table 1 (e.g., as a result of a relatively sudden change in conditions such as a drop in the outside temperature occurring at sunset).

If the inside temperature reaches the deactivation threshold before the allotted time elapses, then the HVAC system is simply deactivated as described above. If, on the other hand, the inside temperature does not reach the deactivation threshold in the allotted time, then the idle control system 10 computes a new desired temperature according to the following formulae: $Temp_{NEW}=Temp_{REACHED}+3$ (for cooling) (with the "3" being derived from taking the temperature range (high limit–low limit) of 6 and dividing it by 2) and $Temp_{NEW}=Temp_{REACHED}-3$ (for heating), where $Temp_{NEW}$ is the new desired temperature and $Temp_{REACHED}$ is the temperature reached at the end of the allotted time.

FIG. 2 depicts a failure to reach a deactivation threshold within an allotted time. As explained above, under normal conditions the inside temperature of the vehicle is controlled between the 74 degree activation threshold and the 68 degree deactivation threshold when the desired temperature is 70 degrees. In the graph, at some point after point B, an event occurred (assume the driver opened a window to 92 degree outside air) preventing cooling of the vehicle interior to the deactivation threshold within the allotted time. When the temperature reaches point C, the idle control system 10 computes the allotted time as 36 minutes (depicted as $T_1$ in FIG. 2). At the conclusion of the allotted time, however, the inside temperature is only cooled to 71 degrees (point D). As the deactivation threshold was not reached within the allotted time, the idle control system 10 will deactivate the HVAC system and compute a new desired temperature of 74 degrees (i.e., $Tem_{REACHED}+3$). The system also calculates new deactivation and activation thresholds of 72 degrees and 78 degrees, respectively, based on the new desired temperature and the equations described above.

Accordingly, the HVAC system will remain off until the inside temperature of the vehicle drifts up to the new activation threshold of 78 degrees (point E). At the beginning of the next cooling cycle, the idle control system 10 again computes the allotted time to reach the new deactivation threshold of 72 degrees. For this cycle, TD is +14 (i.e., the outside temperature has dropped to 84, 84−70=+14), the expected rate is 4 minutes per degree, and the allotted time is 24 minutes (6 degrees (78−72) times 4 minutes per degree; depicted as $T_2$ in FIG. 2). Although not shown in FIG. 2, if the Cummins System fails to cool the interior of the vehicle to the new deactivation threshold of 72 degrees within the allotted time, the system will again adjust the desired temperature upwardly. The desired temperature may need to be automatically adjusted two or more times (not shown in FIG. 2), each being progressively farther from the driver selected desired temperature, until a deactivation threshold is reached within the allotted time.

One consequence of this automatic readjustment is that driver initiated attempts to cause continuous operation of engine 22 will fail. Without the automatic readjustment of the system 10, a driver may be able to let in 92 degree air through a window, select a desired temperature of 70 degrees, and cause continuous engine operation to maintain a relatively comfortable interior temperature of, for example, 71 degrees. Using idle control system 10, however, the above scenario results in a new desired temperature/virtual set point of 74 degrees ($Temp_{REACHED}+3$) being computed after the first cooling cycle, and subsequent starts and stops being based on the new deactivation threshold of 72 degrees and the new activation threshold of 78 degrees. The more warm air the driver lets into the vehicle, the greater the automatic adjustments to the interior temperature of the vehicle. In certain embodiments, absolute boundaries for the desired temperatures/virtual set point are defined, for example 48° F. minimum and 82° F. maximum. Accordingly, control unit 12 may not adjust the desired temperature/virtual set point outside of this range. Similarly, the boundaries may be the trigger points for determining when control unit 12 invokes the vehicle's heating and air conditioning system 26 to assist the accessories 28, 30 in expanded embodiments.

Another behavior programmed into idle control system 10 is a tendency to return to the driver selected desired temperature as conditions permit. More specifically, when idle control system 10 automatically adjusts the desired temperature upon a failure to reach a deactivation threshold, thereby deviating from the desired temperature selected by the driver, it will, during subsequent cycles of operation, automatically adjust the temperature back to that selected by the driver if conditions permit. In the example above, the driver opened the window to 90 degree air and idle control system 10 adjusted the desired temperature/virtual set point to 74 degrees. By reacting to changing conditions, however, idle control system 10 will attempt to adjust the desired temperature back to the driver-selected 70 degrees. For example, if the driver closes the window at approximately point G on the graph of FIG. 2, idle control system 10 may not continue to operate using the adjusted 74 degree desired/virtual set point temperature. Instead, if the new deactivation threshold of 72 degrees is reached within the allotted time (again, 24 minutes as was the case at point E), idle control system 10 will continue to further cool the interior of the vehicle as shown in the graph. The inside temperature the idle control system 10 is able to achieve within the allotted time will become the new deactivation threshold. The idle control system 10 will calculate a corresponding new desired temperature and activation threshold based on the new deactivation threshold and using the equations described above. In the example of FIG. 2, idle control system 10 is able to reach the original deactivation threshold of 68 degrees (point F) within the allotted time, it will adjust the desired temperature back to the operator selected 70 degrees.

In situations where idle control system 10 makes multiple automatic adjustments to the desired temperature/virtual set point (e.g., changes the desired temperature farther and farther from the driver selected temperature), system 10 may also make multiple adjustments back toward the driver selected temperature (as conditions permit) during subsequent cycles of operation. For example, assume idle control system 10 automatically adjusted the desired temperature from 70 degrees, to 74 degrees, to 80 degrees, to 82 degrees before the problem with the cooling system was corrected (e.g., a window was closed). During the next cycle of operation, idle control system 10 may cool the interior well below the current 78 degree deactivation threshold within the allotted time. If, at the end of the allotted time an interior temperature of 76 degrees is reached, then idle control system 10 will consider 76 degrees to be the new deactivation threshold, and compute an adjusted desired temperature/virtual set point of 78 degrees and an activation threshold of 82 degrees according to the equations described above. During the next cycle of operation, idle control system 10 may cool the vehicle to 70 degrees within the allotted time. In that case, 70 degrees is the new deactivation threshold, and the desired temperature/virtual set point and activation threshold are 72 degrees and 76 degrees, respectively. In this manner, idle control system 10 gradually returns to the driver's preferred temperature.

As indicated above, idle control system 10 automatically adjusts the desired temperature in this manner regardless of the reason for a failure to reach a deactivation threshold. When system 10 automatically adjusts the desired temperature/virtual set point, however, it is assumed that some problem exists, and the driver is notified via a message displayed on monitor 14 of idle control system 10. Idle control system 10 will modify the message if it appears that driver manipulation caused the failure to reach the deactivation threshold. Idle control system 10 is programmed to assume that it should be able to cause the interior temperature of any vehicle to deviate from the outside temperature by at least 10 degrees within the allotted time, as long as the vehicle windows and doors are closed. If idle control system 10 fails to reach a deactivation threshold within the allotted time, then system 10 checks the outside temperature signal from ECU 24. If system 10 was able to cause the interior temperature to deviate from the outside temperature by more than 10 degrees, indicating that the windows and doors are closed, system 10 will provide a message such as "Please check filters and Freon, ensure that the temperature controls are at their maximum settings, and ensure that all windows and doors are closed." If, on the other hand, system 10 was unable to cause even a 10 degree deviation, indicating that a window or door is opened, the provided message will read "Please close all windows and doors, check filters and Freon, and ensure that the temperature controls are at their maximum settings."

In addition to controlling the interior temperature of the vehicle, idle control system 10 monitors the operation of the vehicle's batteries 18, and causes engine 22 to operate as needed to charge batteries 18 using the vehicle's alternator 32. As previously noted, idle control system 10 may be used with either AGM, deep cycle, or wet cell batteries 18. In general, idle control system 10 determines the internal State of Charge ("SOC") of batteries 18 based on the DC resistance of batteries 18. Current sensor 80 is used to measure the current into and out of the batteries, and these measurements are used to compute DC resistance and SOC to monitor the operation of batteries 18.

Figure 5:
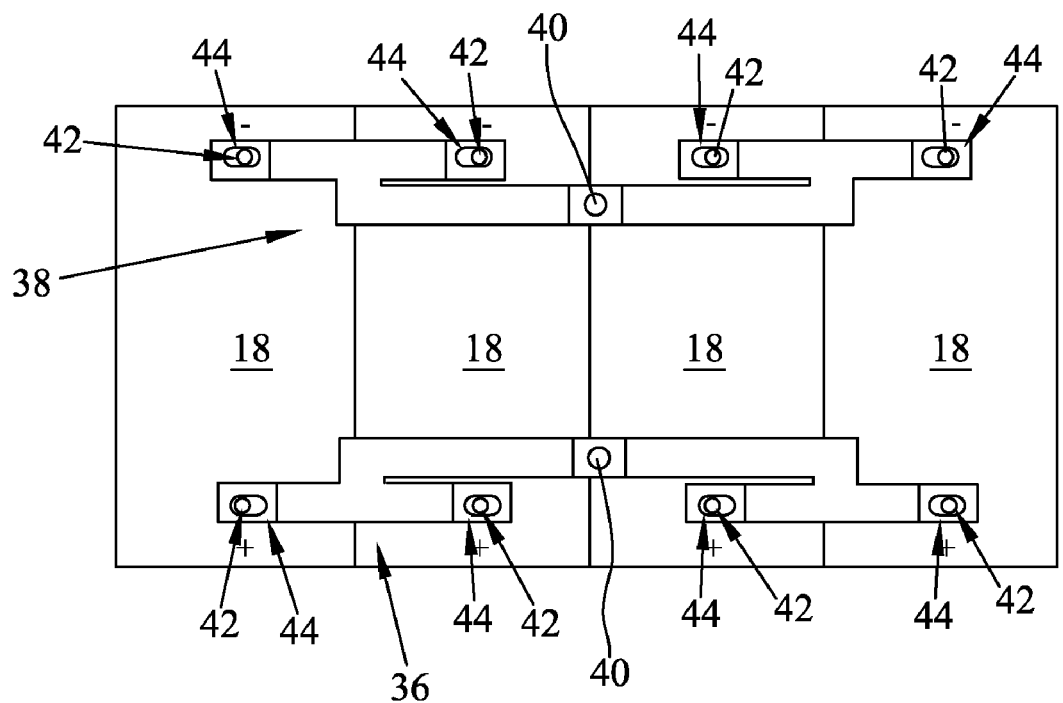
FIG. 5 is a first embodiment of battery connection straps suitable for use with the vehicle of FIG. 3.
Figure 6:
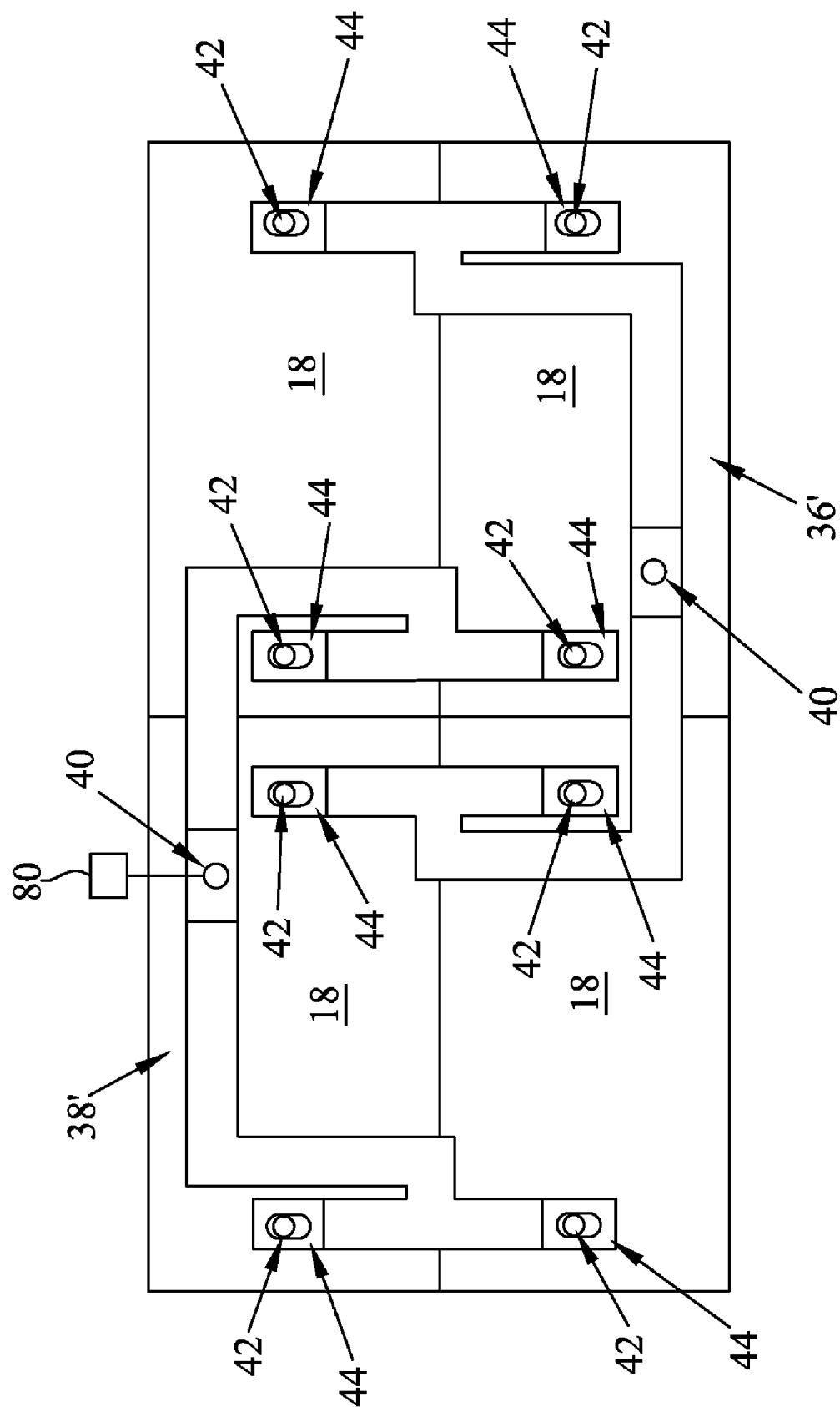
FIG. 6 is a second embodiment of battery connection straps suitable for use with the vehicle of FIG. 3.

Embodiments of balanced load battery couplers 36, 36', 38, 38' are shown in FIGS. 5 and 6. Couplers 36, 36', 38, 38' include electrically conductive material that is selectively covered with molded polymer insulation. The conductive material is exposed at load attachment points 40 and battery attachment points 44. Current sensor 80 is attached at attachment point 40 of one of positive battery coupler 36, 36', negative battery coupler 38, 38' or both to take readings therefrom. Attaching current sensor 80 to one or both attachment points 40 provides that all current from all batteries is "seen" by current sensor 80. Battery terminals 42 electrically couple to battery attachment points 44 of couplers 36, 36', 38, 38'. Thereby, couplers 36, 36', 38, 38' provide a connection to each of the plurality of batteries 18. The lead distance, the distance that current must travel within each coupler 36, 36', 38, 38', between load attachment point 40 and each battery attachment point 44, is substantially equal. Couplers 36, 36', 38, 38' provide that each battery 18 sees a substantially similar load. Accordingly, batteries 18 discharge at similar rates as no one battery 18 sees significantly different loads than other batteries 18.

Current sensor 80, FIG. 6, is a non-intrusive current sensor that utilizes the hall effect. Sensor 80 monitors current output of alternator 32 and return current of battery 18. Sensor 80 also includes lines to measure voltage of alternator 32 and battery 18. Accordingly, sensor 80 receives four inputs, alternator current, battery return current, alternator voltage, and battery voltage. Current sensor 80 measures up to 200 A with a resolution of +/−100 mA at the lower end of the current scale. Sensor 80 provides many outputs including:

Voltage drop of the charging system, $V_{drop}=(V_{alternator}-V_{battery})$ at 100 A by alternator;

Energy being provided by alternator 32, $Ah_{alternator}=I_{alternator} \times Hr$;

Vehicle electrical load with engine on, $I_{vehicle\ load\ engine\ on}=(I_{alternator}-I_{battery\ return})$;

Vehicle electrical load with engine off, $I_{vehicle\ load\ engine\ off}=ABS(I_{battery\ return})$;

Total energy load with engine on, $Ahr_{alternator}=I_{vehicle\ load\ engine\ on} \times Hr$(at charge cycle);

Total energy load with engine off, $Ahr_{battery}=I_{vehicle\ load\ engine\ off} \times Hr$(at charge cycle); and Total available energy to batteries 18, $Ahr_{avail}=I_{battery\ return} \times Hr$(at charge cycle). (Available energy does not include charging battery efficiency (battery impedance)).

With respect to the readings, it should be appreciated that the greater amount of current loading on batteries 18 at any instant of time, the lower the measured battery voltage for that period of time. The true open circuit voltage ($V_{open\ circuit}$) for battery 18 determines the state of charge of batteries 18. When voltage is being measured to determine the state of charge, the amount of current loading at the time of the measurement will give false readings. Therefore, an offset is used as related to the amount of vehicle current loading at any instant of time. The offset is either stored as a lookup table or via an equation to determine true open circuit voltage.

Sensor 80 also provides outputs including:

True open circuit voltage as related to vehicle load, $V_{open\ circuit}=V_{battery}+DC\ resistance \times I_{batt}$;

Energy stored ($Ahr_{stored}$) at $V_{open\ circuit}$;

Energy used at $V_{open\ circuit}$;

Comparisons of stored energy to used energy at $V_{open\ circuit}$;

Current draw at time $V_{open\ circuit}$ is measured;

Battery charging efficiency, ($Ahr_{stored}/Ahr_{avail} \times 100$ at the related $V_{open\ circuit}$ of $Ahr_{stored}$);

True state of charge for the battery, $SOC_{batt}=V_{open\ circuit}$ (battery type factor);

Determination of battery type by determining $Ahr_{avail}$ as related to $V_{open\ circuit}$;

Determination of a charging problem if there is excessive voltage drop in power lines, $V_{drop}>0.5V$ at 100 A;

Determination of a charging problem for a bad battery by measuring Ahr going into batteries 18 and Ahr going out of batteries 18 to determine if batteries 18 are deteriorating in reserve capacity;

Calculation of energy being such that determinations of when to turn on the engine can be made;

Energy use in charging batteries 18 including use of $V_{battery(engine\ off)}$ for calibration; and Battery 18 cycle count.

Upon initial start up of idle control system 10, it is assumed that batteries 18 are new, or at least in very good condition. As new batteries 18 are generally not fully charged, idle control system 10 detects when batteries 18 are being charged (i.e., engine 22 is running), and monitors the current provided to batteries 18 by alternator 32. After some period of time, the batteries' SOC reaches an essentially steady-state condition. Idle control system 10 assumes going forward that the SOC associated with this steady-state condition corresponds to the batteries' maximum SOC.

Idle control system 10 also determines whether batteries 18 are wet cell or AGM batteries based on the known internal impedance characteristics of those battery types. Idle control system 10 is programmed with data indicating the maximum recommended depletion of the battery types (in percentage of maximum SOC). Knowing the type of battery, the maximum SOC, and the maximum recommended depletion percentage, idle control system 10 computes the minimum SOC threshold below which batteries 18 should not be drained. When the SOC of batteries 18 falls below this minimum threshold, idle control system 10 will start the engine 22 to charge batteries 18.

Figure 9:
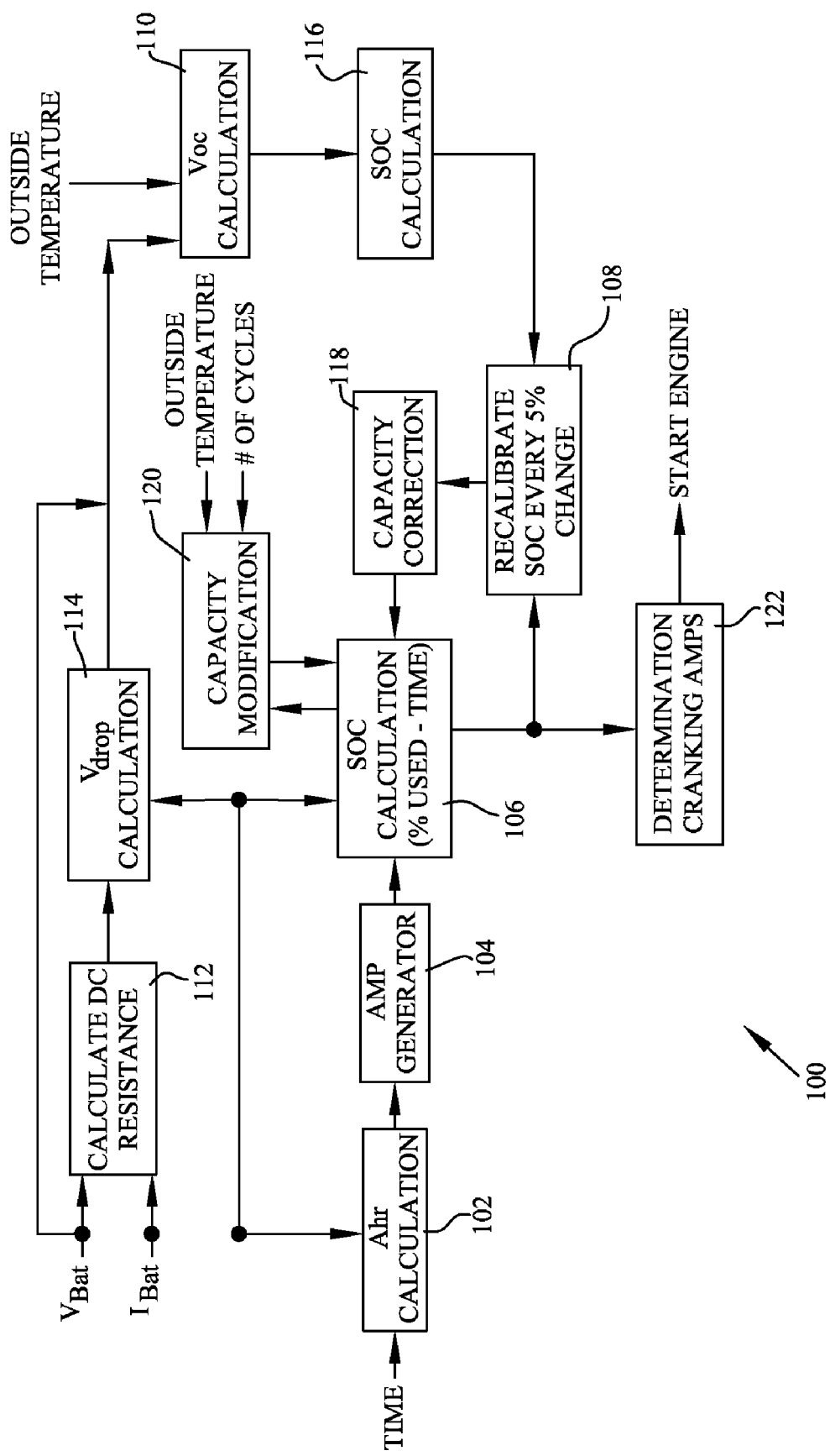
FIG. 9 is a block diagram of a method battery charging maintenance.

A second embodiment method for a battery charging maintenance system algorithm 100 is now disclosed with reference to FIG. 9. FIG. 9 shows a method of calculating the SOC used in conjunction with a SOC calibration calculation. By using the two calculations together, the battery charging maintenance system algorithm can be self-adjusting and adaptive. Such adjustment/adaptation allows maximizing of the amount of energy that can be taken out of a battery system for loads while still maintaining enough energy to start engine 22 in all conditions.

When batteries 18 are first connected to CEMS 12, the state of batteries 18 is unknown including the capacity of batteries 18 at 77° F. and the health of batteries 18.

Current from batteries 18 is sampled once a second for 360 seconds (6 minutes). The 360 current values are then summed and the sum is divided by 3600 (the number of seconds in an hour) to arrive at the energy expended over a 6 minute period in Ahr. (Step 102). Then, the resulting value is multiplied by ten to determine the average Amperes generated per segment of Time (6min). (Step 104)

Then, the SOC is determined, step 106, using Peukert's Law. Peukert's law provides the length in time (hours) that a battery will supply energy until the battery energy is exhausted.

Peukert's Law: $T = R/(I*R/C)^N$,

T=The length of time it takes for a battery to go from 100% to 0% SOC in hours.

R=The rate, amount of time per a specific load for discharge of a battery, e.g. 20 hr rate.

I=The amount of load being applied in Amps.

C=The capacity of the battery measured in Ahr to a certain Rate (R).

N=The battery constant, e.g. 1.1-1.3, typical 1.2.

The Rate (R) will be held constant at 20 hr. and the Capacity (C) will be assumed to be 400 Ahr per 25° C. at the start of a power-up cycle (battery power is first connected). This assumed capacity may be changed after the power-up cycle, depending upon the outside temperature. The outside temperature will be taken via temperature sensor 25 or from another sensor (not pictured) near the batteries and will be considered the temperature of the batteries. Peukert's Law is changed to minutes by multiplying by 60 or $T = 60 \times R/(I/C/R)^N$. The Depth of Discharge (DOD) is then calculated by taking the ratio of $6 \div 60 \times R/(I/C/R)^N$. This DOD is then summed for each 6 minute segment of time. The SOC is then determined by the following SOC=1−DOD.

Occasionally, the determination of the SOC needs to be recalibrated, step 108. The SOC is recalibrated when there is a greater than 5% difference between the calculated SOC, step 106, and a SOC determined from a manufacturer's Voc, step 110.

Voc=$[\{(V_0-V_1)/(I_1-I_0)\} \times I_1] + V_1$.

$V_0$=Battery voltage at t=0

V1=Battery voltage at t=1

$I_0$=Amount of current being applied to the battery at t=0

$I_1$=Amount of current being applied to the battery at t=1

The true Voc is determined by measuring the DC Resistance ($R_{batt}$) of the battery, step 112. The DC Resistance is calculated by observing the voltage and current ($I_0$ & $V_0$) of the battery at a certain instant of time and then comparing the voltage and current ($I_1$ & $V_1$) at another instant of time. The DC Resistance is derived by using the following expression $(V_0-V_1)/(I_1-I_0)$. $R_{batt}$ is measured every 15 minutes and then stored & mapped to batteries SOC. If another reading can be made at the same SOC that is greater than the $2 \times I_0$, then this value should be used instead and put into the SOC vs $R_{batt}$ mapping.

The voltage drop is calculated, step 114, at the end of each 6 minute segment by $V_{drop} = I_{ave} \times R_{batt}$.

The true Voc is determined, step 110, after each 6 minute segment of time by: Voc=$V_{batt}+V_{drop}$.

The SOC is then calculated, Step 116, by using the true Voc with the following expression:

SOC (battery)=−763.0+66.87×Voc (assuming the use of Northstar, Lifeline, or Dynasty batteries).

Next, algorithm 100 determines if the calculated SOC, step 106, varies by more than 5% from the SOC Determination via Voc, step 116. If it does, then the calculated SOC is replaced the SOC determined via Voc (Manufacturers Voc) and this SOC is used as the starting point for recalculating the SOC with a new capacity, step 118.

The capacity is recalibrated, step 118, using the following expression, $C = IR/(R/T)^{1/N}$ (See Peukert's Law above for an explanation of the variables).

Step 118 determines if the calculated SOC by percentage of time is greater or less than the manufacturer's determined SOC from the Voc. If the calculated SOC is greater, then the battery capacity is reduced by reducing T. If calculated SOC is less, then battery capacity is increased by increasing T.

The new value of T is obtained by either increasing or decreasing T by the difference in the amount of error from the calculated SOC to the manufacturer's determined SOC.

Current is calculated using the average current used by summing up the Iave for the different 6 min time segments & then dividing by that number of 6 minute time segments.

The 20 hr rate is used for R and 1.25 is used for the value of N.

The new battery capacity ($C_{calc}$) is then recalculated at the current battery temperature in ° F. The Battery Capacity (C) is then normalized for 77° F., by $C_{77° F.F} = C_{calc}/(0.6961 + 0.005271 \times 77 − 0.000017 \times 77**2)$ The Battery Life Cycle Counter ($BC_{life\ cycle}$) is then reset. This reset is done each time the Battery Capacity Determination Algorithm is used to correct the capacity.

The expected battery capacity (C) is modified, step 120, based upon the outside temperature and the number of battery cycles. Whereas the capacity stored in memory, step 118, is normalized to 77° F., actual capacity is influenced by the outside temperature.

$C = C_{norm} \times (0.6961 + 0.005271 \times \text{Temp} \ (° \ \text{F.}) − 0.000017 \times \text{Temp} \ (° \ \text{F.})**2)$ Additionally, capacity decreases based upon the number of cycles experienced by the battery. When $BC_{life\ cycle}$=10, the battery capacity is decreased by 1 Ahr. $BC_{life\ cycle}$ is reset to zero after each time this algorithm is used to decrease the battery capacity by 1 Ahr.

The alternator and battery voltage are measured to determine the $V_{Drop} = V_{Alt} − V_{Batt}$ when current to the batteries is measured to be greater than 100 Amps.

$V_{Drop}$ is an indication that there is too much resistance in the lines, which typically signifies excessive corrosion on the power line connections. This excessive drop in voltage reduces the amount of energy being supplied to the batteries.

$V_{Drop}$ is logged for each CEMS activation and trended in order to do predictive maintenance on the power lines. A $V_{Drop}$ of 0.5V typically indicates that the power line connections need to be cleaned of corrosion.

A non-intrusive hall effect current sensor, possibly part of sensor 80, or shunt monitors current output of the load and return current of the battery. Using the current reading (Amp) from the load (measured at the load) plus the current reading (Amp) from the battery equates to the total current being supplied by the alternator, given by the relationship, $I_{alternator}(A) = I_{battery}(A) + I_{load}(A)$. Current sensor 80 may also be placed at the alternator, providing the $I_{alternator}(A)$ directly.

Upon power up, CEMS considers the highest measured output of the alternator as an indicator of the maximum output of the alternator. In other words, the system monitors the maximum output by looking at the peak power being be produced by the alternator per a certain engine RPM. This is recorded and then considered as the maximum current rating for the alternator. This remains true until the next power-up sequence.

If at any time the alternator output becomes less than 90% of the amount of peak power that the alternator can be provide, then the CEMS system alerts the driver of need to replace the alternator.

During a power-up sequence, CEMS assumes a battery capacity of 400 Ahr per 25° C. and consider the batteries as new. The battery capacity changes relative to the number of cycles, temperature, and the amount of loading being applied. Therefore, the batteries should be replaced when the battery capacity reduces capacity by greater than 20%, relative to the 25° C. temperature and a loading of 20 Amps for a 4 battery system. The batteries can still be used beyond the 20% reduction in capacity per 25° C. but much caution will need to be taken to ensure that the engine can still start.

The Hall Effect Sensor can determine direction of the current flow and therefore orientation should be noted when placing it on a vehicle's battery charging system. To decrease the possibility of these sensors being installed backwards, a reconfiguring algorithm is provided.

The current sensor on the battery considers whether the current is negative or positive. When engine RPM is greater that 450 RPM, then the current should be positive. If not, then put a flag in non-volatile memory that will be used to change the current readings by multiplying the measured current by (−1) or simply changing the sign of the measured current readings.

For the load sensor, the current will always be going in one direction. Therefore, when current is being sensed by the current sensor and the current is negative, then put a flag in non-volatile memory which will be used to change the sign of the current readings.

When the stored energy in a battery reaches a certain energy threshold, step 122, then CEMS will re-start the engine to charge the batteries. This algorithm is self learning such that with time it allows more energy to be used from the battery as it allows a lower DOD per the changing conditions of ambient temperature and battery cycles. The following parameters are measured and recorded during a start sequence: engine RPM, battery voltage during start, depth of discharge (DOD) prior to start, capacity of batteries that take into account the number of cycles and ambient temperature, and oil temperature. The engine RPM needs to stay above 120 RPM and Battery Voltage greater than 8V during a starting event. As the ambient temperature increases so will the ability to go lower in DOD.

Since the battery capacity has been changed due to the number of factors, e.g. battery cycles, battery temperature, and DOD of battery, the battery is discharged until the SOC of battery is such that the derived battery capacity will be able to provide enough energy to start an engine to a speed greater than 120 RPM with a $V_{batt}$ greater than 8V.

On power-up, the start sequence commences when the DOD is 50% when considering a 400 Ahr battery capacity. As each cycle (charging/discharge) is completed with an engine start the following are mapped: engine RPM during cranking, average battery voltage during cranking, oil temperature at the time of cranking, and DOD prior to cranking.

CEMS 12 automatically maps the conditions and starts the engine accordingly.

Regarding engine on and off times, the system 10 may limit the maximum number of engine starts per hour (e.g., 5 starts per hour) by keeping track of engine off time. For example, if the desired maximum number of starts per hour is five (i.e., a minimum cycle time of 12 minutes) and the engine is off for the first four minutes of the hour, but needs to be started to maintain the interior temperature of the vehicle, control unit 12 computes the minimum on time by subtracting the last off time from the minimum cycle time (i.e., minimum on time=12 minutes−4 minutes=8 minutes). Thus, when the engine is started, the control unit 12 causes it to continue to run for at least 8 minutes, even if the desired interior temperature is reached earlier (during temperature control operation) or if the battery energy is replenished earlier (during battery charge operation). If more than eight minutes is required to achieve the desired result (temperature or charge) the control unit 12 will cause the engine to continue running. Thus, the system ensures that the engine is not started more than once every 12 minutes. On time and off time are logged for purposes of tracking the efficiency of the system (i.e. to show fuel savings and emissions reduction.) Accordingly, system 10 is provided with a number of software modules capable of saving and processing the engine and temperature data to provide a number of reports. Such data and reports may be displayed on monitor 14 upon request by the user or may be downloaded to a separate computer. Such download may be via a corded interface, such as a J1939 cord that interfaces with system 10 or the system may have wireless data transfer such as a Wi-Fi or Bluetooth connection. The data storage functionality provides for control module 12 to perform similarly to the "black box" of commercial aircraft. The reports may take the form of suggested accessories that could be added to achieve additional fuel efficiency.

One such report is a report that determines the emissions output of engine 22. The report receives inputs such as fuel rate, engine statistics (size, cylinders, etc.), and load measurements to compute actual engine emissions. The result may take the form of grams per hour. The result may be compared to legislated emissions requirements. Accordingly, the output may be fed back to the CEMS to prevent engine 22 from exceeding the emissions requirements. One such way that CEMS may work to reduce emissions when nearing legislated requirements is to utilizing less than all of an engine's cylinders (i.e. going from 6 to 3 cylinders).

Installation of a idle control system 10 includes the installation of a number of sensors that ensure that proper conditions are met to allow engine 22 to be started at the direction of control unit 12. Sensor installations are further described below with reference to FIGS. 10-12. One such sensor is a hood tilt sensor 19. Hood tilt sensor 19 monitors whether the hood is open or closed. When the hood is open, such as when engine 22 is being worked on, control unit 12 is locked out from automatically starting engine 22. Accordingly, control unit 12 can not start engine 22 when it is being worked on. Similarly, another sensor is a neutral position sensor 21. Neutral position sensor 21 determines whether the vehicle is engaging a forward or rearward gear. Starting engine 22 when it is engaging a forward or rearward gear potentially causes the vehicle to begin travel. Functionality is also included that assures that neutral position sensor 21 is not issuing a false positive, such as a false positive because of debris engaging sensor 21. Accordingly, neutral position sensor 21 prevents automatic starting of engine 22 from causing vehicle travel. Yet another possible sensor is a parking brake sensor 23. Similarly to the neutral position sensor 21, parking brake sensor 23 checks to ensure that parking brake is engaged prior to engine 22 starting to help prevent driverless travel.

Figure 4:
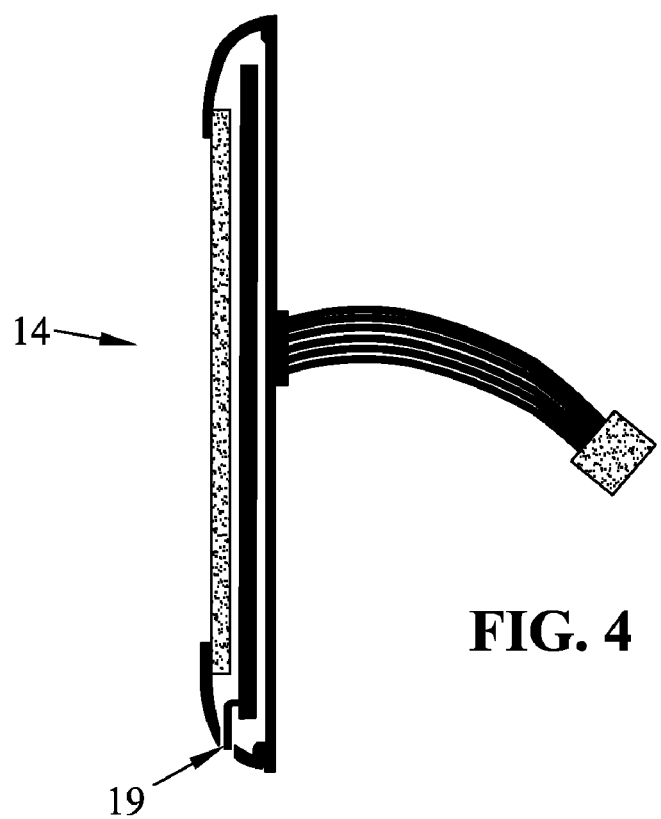
FIG. 4 is a side view of the monitor of the hardware configuration of FIG. 1.

In addition to taking user inputs, monitor 14 also provides diagnostic information that assists a user in determining and correcting any faults in the system. Such faults may be indications from the above listed sensors 19, 21, 23 or other indications. The diagnostic information may also include steps to be performed by the user that allow the problem to be isolated. The provided information may also include illustrations to aid in directing the user through the steps. Monitor 14 may also provide information to a user regarding preventative maintenance. Such preventative maintenance may include suggesting replacement or cleaning of selected electrical lines by determining voltage drops across existing lines and determining capacity reduction within existing batteries. Monitor 14 may also function as a multimedia monitor to play TV programs, movies (with a VCR or DVD player or other source), WWW content, or navigation aids. In such embodiments, control unit 12 breaks in and disrupts multimedia presentations when the system 10 needs to use monitor 14 to convey system information to a user. Multimedia sources may be plugged directly into monitor 14 or may be plugged into control unit 12 that performs the input switching to determine which input is allowed to be output. Monitor 14 may be a touchscreen such that a separate input device is not necessary. Such a monitor 14 is shown in FIG. 4. Monitor 14 of FIG. 4 includes a temperature sensor 29 therein so as to provide the functionality of thermostat 15.

System 10 is optionally provided with audio speakers. Such speakers allow system 10 to provide an audible indication of whether system 10 is activated or not. Alternatively to, or in conjunction with, the speakers, system 10 may have a visual indication, such as a light or display on monitor 14, to indicate whether system 10 is activated or not.

Yet another embodiment of the present disclosure is provided for determining heating/cooling operation by control module 12. Control module 12 may be fitted with a humidity sensor. The desired temperature is changed to favor a reduction in energy consumption. However, if heating and cooling needs favor the driver's comfort, then the humidity reading would be ignored. The heating/cooling algorithm incorporates a Humidity Correction Factor Algorithm if it favors the reduction of the vehicle's energy consumption. A Comfort Index Temperature (CIT) is calculated as $CIT=1.059 TMP_{ACT}+0.093H-10.44$, where $TMP_{ACT}$ is the actual temperature and H is humidity being read from the sensor. Table 2 is a summary of when the CIT or the Actual Temperature ($TMP_{ACT}$) is used for when the heating/cooling is turned off/on. Table 3 provides definitions for many of the abbreviations used herein.

TABLE 2

CIT Utilization Table

| | |
|---|---|
| $CIT \leq TMP_{AC}$ | During heating state, Use Actual Temperature |
| $CIT \geq TMP_{ACT}$ | During heating state, Use Comfort Index as the new recorded temperature |
| $CIT \leq TMP_{ACT}$ | During cooling state, Use Comfort Index as the new recorded temperature |
| $CIT \geq TMP_{ACT}$ | During cooling state, Use Actual Temperature |

TABLE 3

| | |
|---|---|
| TS | Time Segment in minutes that it takes for the temperature to go 1° F. (actual or Comfort Index). |
| HCC | Heating/Cooling Cycle is the sum of TS until the HL or LL has been reached. |
| HL | High Limit which is the set point or virtual set point plus Range/2 for heating. |
| LL | Low Limit which is the set point or virtual set point minus Range/2 for cooling. |
| $TMP_{CAB}$ | Cab Temperature is either actual temperature or the Comfort Index Temperature (CIT). |
| $TMP_{ACT}$ | Actual cab temperature and does not consider CIT. |
| $TMP_{AIR}$ | Actual outside ambient temperature. |
| CIT | Comfort Index Temperature as given by $1.059(TMP_{ACT}) + .093H - 10.44$ |
| H | Humidity as observed in the cab. |
| VSP | Virtual Set Point. A new temporary set point is issued if $TMP_{CAB}$ cannot be achieved. |
| SP | Actual Set Point requested by operator. |
| $T_{MAX}$ | Maximum time determined from maximum slope allowed per the number of degrees. |
| $T_{REM}$ | Time left from the original maximum time determined. |
| $S_{MEAS}$ | Measured slope which relates to # of minutes/1° F. |
| $S_{MAX}$ | Maximum slope per the NOD table which relates to # of minutes/1° F. |
| Range | HL-LL; set to = 6 in the described embodiments. |

The method provides for determining heating/cooling operation by using time and temperature slope. The method defines a Normal Operating Algorithm. The algorithm dictates that a maximum slope is determined by taking a difference between the $TMP_{(AIR)}$ (the outside ambient temperature) and the $TMP_{(ACT)}$ (Actual cab temperature without consideration of a Comfort Index Temperature (CIT)). A difference less than zero defines a heating state and a difference greater than zero defines a cooling state. This difference value is then categorized to determine the Maximum Slope ($S_{MAX}$) allowed per the weather conditions (Table 1).

Next, a maximum time to reach temperature per the maximum slope allotted for the outside weather conditions is calculated. The Maximum Time ($T_{MAX}$) is calculated by $T_{MAX}=(TMP_{(ACT)}-LL) \times S_{MAX}$. Where LL is the lower limit, either the set point or the virtual set point minus the range/2 for cooling. ($T_{MAX}=(HL-TMP_{(ACT)}) \times S_{MAX}$ for heating).

Each time segment (TS) has a slope measured ($S_{MEAS}$) by determining the number of minutes it takes to change by 1° F. If the temperature starts to move in the wrong direction, then a Wrong Temperature Direction Algorithm, discussed below, is employed. If the temperature remains stationary, then a No Temperature Change Algorithm, discussed below, is employed.

The time remaining ($T_{REM}$) is determined by subtracting the Measured Slope $S_{MEAS}$ from $T_{MAX}$. Thus, $T_{REM}=T_{MAX}-S_{MEAS}$. If a new $S_{MAX}$ is observed (weather conditions have changed) or new Heating/Cooling Cycle (HCC) has started, then the $T_{MAX}$ will be recalculated. For each new TS, a new $T_{REM}$ is calculated by using previous $T_{REM}$ and subtracting the new measured slope $S_{MEAS}$.

If time runs out ($T_{REM}=0$) and the desired temperature has not been achieved, then a Virtual Set Point (VSP) will be issued. This is derived by taking the current cab temperature $TMP_{CAB}$ (either the actual temperature or CIT) and adding range/2 for cooling and subtracting range/2 for heating. This new VSP will be used when a new HCC is initiated or a new $S_{MAX}$ is observed. A VSP may be modified, either increased or decreased with the desire to get the VSP=SP. If a VSP has been issued and the temperature has been achieved for the VSP and $T_{REM}\neq 0$, then continue heating/cooling until $T_{REM}=0$ or VSP=SP and then turn off heating/cooling.

Figure 3:
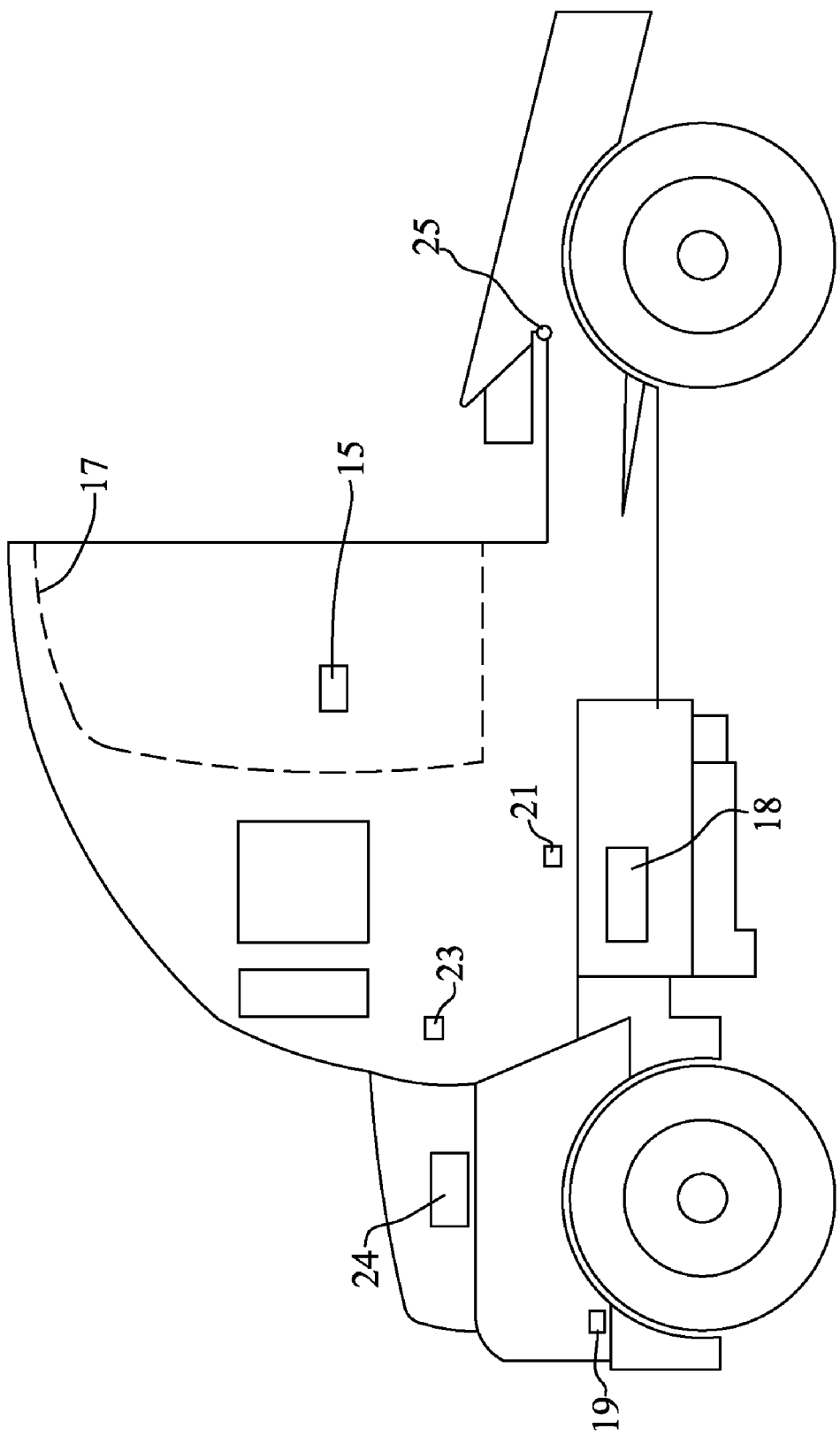
FIG. 3 is a vehicle suitable for employing the hardware configuration of FIG. 1.

Additionally, outside temperature is determined from information provided by ECU 24. Whereas temperature sensor 25 is shown in FIG. 3 as being outside the engine compartment, other embodiments are envisioned where temperature sensor 25 is located within the engine compartment. In such embodiments, the temperature is only taken when the engine RPM>0. Once RPM=0, then the temperature will not be taken until a certain length of time has expired because temperature sensor 25 is located in the intake of engine 22 and is affected by the heat rejection from engine 22 once it is off. Regardless of position, temperature sensor 25 may be activated via system 10 independently of activation of ECU 24. Accordingly, current that would be drawn by ECU 24 is avoided and current consumption is reduced.

As previously noted, the method includes a Wrong Temperature Direction Algorithm. This algorithm dictates that if the temperature proceeds more than 2° F. in the wrong direction when the engine and/or HVAC accessory is on (cool state the temperature increases and for heat state the temperature decreases) then a message flashes across monitor 14 that the vehicle's HVAC is set wrong or the windows need to be closed. After the temperature has increased 2° F. in the wrong direction, then system 10 continues to run for 8 minutes to allow the condition to correct itself. If it does not, and the temperature is equal to the starting temperature or still going in the wrong direction, then engine 22 is cycled 20 min ON and 10 min OFF. After each 20 min on cycle, if the cab temperature starts going in the right direction and the temperature is better than the starting temperature, then the last temperature observed is taken and the High or Low Limit (HH or LL) is added thereto to get the cooling or heating virtual set point. The automatic cycling is stopped and normal operation is resumed with the new virtual set point. If the cycling occurs for more than 2 hours or four (4) complete cycles, then the idle control system 10 discontinues temperature control and only starts the engine as needed to charge the vehicle batteries or until the operator requests activation via monitor 14. Also, limits may be placed on the number of cycles permitted per hour before cab state is turned off.

Also as previously noted, the method includes a No Temperature Change Algorithm. This algorithm dictates that if the weather condition is Most Severe (i.e., it is either 70+degrees colder outside than the set point or 35+degrees hotter outside than the set point), then the engine and/or accessory HVAC is permitted to run continuously. Under these circumstances, the idle control system 10 will run continuously until either the deactivation threshold is reached or TD decreases to one of the non-extreme ranges listed in Table 1.

A related behavior of the idle control system 10 is its response to a failure to change the inside temperature when TD is in a non-extreme range. A failure to change the inside temperature under these less extreme conditions indicates a problem with the vehicle's HVAC system or driver tampering. Accordingly, when (1) TD falls within a non-extreme range, (2) the desired temperature has not been reached, and (3) the inside temperature fails to change by at least one degree within 10 minutes, the idle control system 10 will provide a message to the driver on the monitor such as "Please check filters and Freon, ensure that the temperature controls are at their maximum settings, and ensure that all windows and doors are closed." The idle control system 10 will also establish a new desired temperature as the current temperature plus four degrees (if cooling) or minus four degrees (if heating). The new deactivation and activation thresholds are computed in the manner described above.

After establishing a new desired temperature, the idle control system 10 determines whether the new desired temperature exceeds a predefined upper limit of 82 degrees or a predefined lower limit of 48 degrees. If the desired temperature has been automatically adjusted to exceed either limit, the idle control system 10 causes automatic cycling of the HVAC system in the manner described above (i.e., 20 minutes on, 10 minutes off, 20 minutes on, etc.). At the end of each 20 minute on cycle, the idle control system 10 determines whether the inside temperature is less than 79 degrees (if cooling) or greater than 51 degrees (if heating). If the inside temperature satisfies the appropriate condition, then the idle control system 10 establishes a new desired temperature as the current temperature plus four degrees (if cooling) or minus four degrees (if heating). The new deactivation and activation thresholds are computed in the manner described above. Thereafter, the idle control system 10 resumes normal operation.

As previously described, idle control system 10 includes a central "CEMS" and a plurality of sensors. Sensors include temperature, humidity and other sensors. As shown in FIG. 7, control unit 12 comprises body 13 and shroud 13'. Shroud 13' includes a plurality of connectors partially encapsulated in encapsulating material before shroud 13' is connected to a substrate. Subsequent to formation of shroud 13', an encapsulating material joins body 13 and shroud 13' and forms a seal therebetween. Sensors may be included in various electronic components of the vehicle or may also be provided in an electronic assembly.

FIGS. 10, 11 and 13-16 depict alternative embodiments of an electronic assembly according to the present disclosure. The electronic assembly may be shaped to form a female cavity adapted to receive a male plug (shown in FIGS. 10-11 and 13-15), to form a cap (shown in FIG. 16) or to form a male plug adapted to couple to a female receptacle (shown in FIG. 17). The assemblies may include additional features, e.g. threaded through-holes, snaps, clips and the like (not shown), for attaching the assemblies to receptacles or plugs or to the vehicle's frame. The electronic assembly may be configured as a CEMS, or it may be configured as a sensor assembly which may include one or more transducers and switches as well as electronic components to digitize transducer signals and output data corresponding thereto. A CEMS may include static and addressable electronic devices. Static devices include resistors and capacitors. Addressable devices include logic array gates, processors, data storage devices and the like. Sensor assemblies may include, for example, temperature, humidity, vibration, and position transducers, open/closed witches, magnetic switches, and other transducers and switches configured to detect a state or position of a vehicle's moving part, for example a door or hood. Sensor assemblies may also incorporate timing devices to signal the duration of a state of a transducer, e.g. open/closed. Position transducers may include accelerometers, gyroscopes, and inertial and magnetic transducers. Transducers may be static devices, dynamic devices (devices having moving parts), and also may be addressable devices such as integrated circuits including MEMS (microelectromechanical system) devices. Exemplary MEMS integrated circuits are distributed by Analog Devices, Inc.

Figure 10:
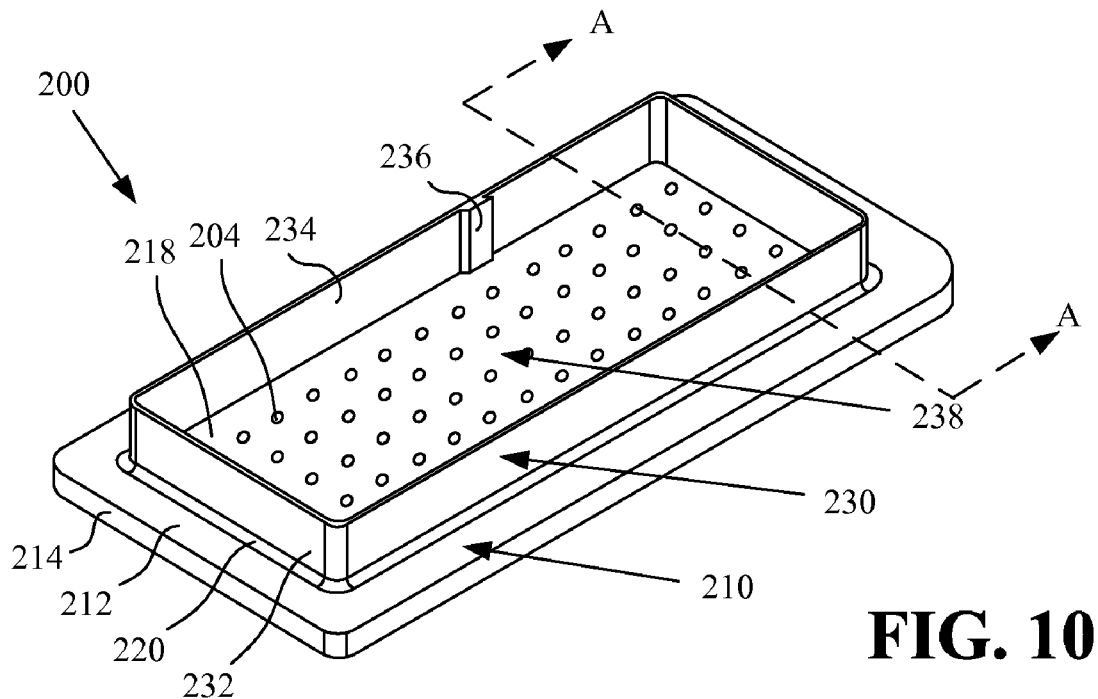
FIG. 10 is a perspective view of electronic assembly.
Figure 11:
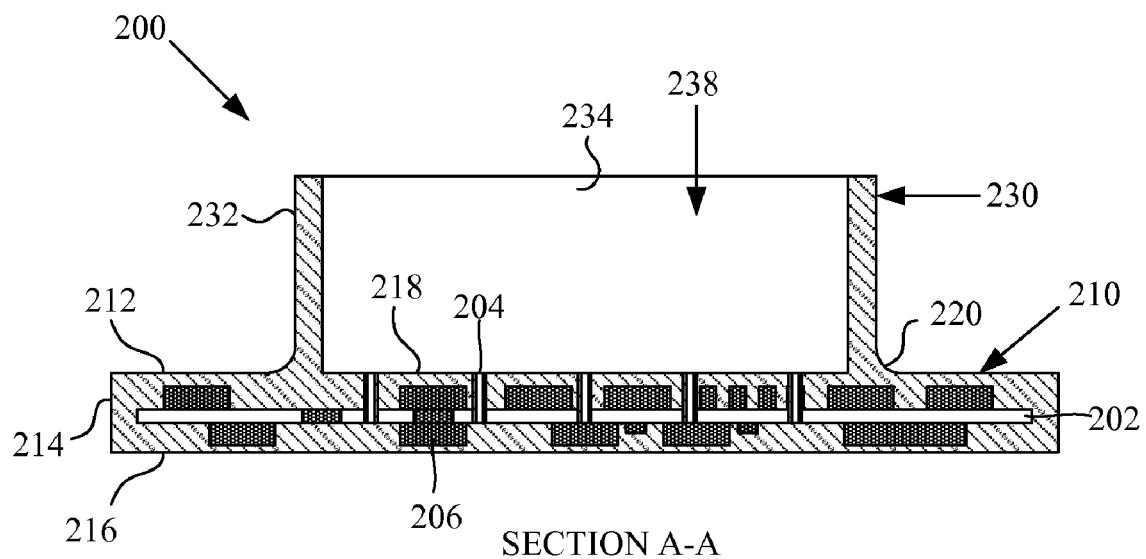
FIG. 11 is cross section plan view of the electronic assembly of FIG. 10.

Referring now to FIGS. 10 and 11, assembly 200 is shown. Assembly 200 comprises body portion 210 having first surface 212 spaced apart from second surface 216 and connected thereto by surface 214, and shroud portion 230 extending from first surface 212 and having interior surface 234 spaced apart from exterior surface 232. Shroud portion 230 defines a cavity adapted to receive a plug connector, thus assembly 200 may be referred to as a female assembly. The region where shroud portion 230 contacts body portion 210 is the transition region. Body portion 210 and shroud portion 230 comprise an encapsulating flowable material. Exterior surface 232 may comprise fillet surface 220 configured to provide additional support to shroud portion 230. Fillet surface 220 may have a curvature radius greater than the thickness of shroud portion 230 which is defined by the smallest distance between interior surface 234 and exterior surface 232. Additionally, body portion 210 comprises interior surface 218 having a plurality of orifices adapted to enable contact by external connectors to connectors 204. Interior surface 234 may also comprise a fillet surface (not shown) configured to provide additional support to shroud portion 230. Additionally, protrusion 236 may extend from interior surface 234 to prevent insertion of an incompatible male plug, or a compatible plug oriented incorrectly, into female receptacle 238 which is formed by shroud portion 230 and interior surface 218. Female receptacle 238 is disposed opposite substrate 202. A compatible plug (not shown) may include a complementary notch. Alternatively or additionally, shroud portion 230 may include a notch adapted to receive a compatible protrusion extending from a compatible plug. Additional protrusions may be provided to create or improve a seal formed between a compatible plug and integrated assembly 200.

Body portion 210 encapsulates substrate 202 and component(s) 206, and partially encapsulated connectors 204. Substrate 202 may be a printed circuit board having conductive surface traces and connectors adapted to provide a predetermined connection pattern between connectors 204 and component(s) 206. Components 206 may be positioned on either of two opposite exterior surfaces of substrate 202. Additionally, components 206 may be disposed at least partially between the two opposite surfaces. Substrate 202 may comprise a plurality of layers disposed between the two opposite exterior surfaces, each intermediate layer (not shown) having different conductive traces and enabling construction of more complex assemblies than are possible with single layer substrates. Connectors 204 may be male, e.g. pins, or female, e.g. sockets. Sockets are shown.

Substrate 202 is encapsulated with a flowable material adapted to protect the substrate and the components from dirt and moisture. A flowable material is any material which may be transformed from a fluid to a solid state to encapsulate substrate 202. Flowable materials include materials which may be solid until heated above a transition temperature and which solidify when cooled below the transition temperature. Flowable materials also include liquid materials which solidify upon chemical reaction, for example by the introduction of, and combination with, a catalyst or hardener. Flowable materials include polymeric and ceramic materials. A flowable material solidifies after forming assembly 200. The transition from fluid to solid may be reversible, as in the case of polymers which are not cross-linked, or irreversible, as when polymers are cross-linked. Flowable materials may be pure (virgin) and reprocessed virgin materials and may also include processing additives such as stabilizers, plasticizers, and lubricants, and other additives such as particulate fillers, fibers, colorants, metal dust, nanoparticles and the like. Polymers include thermoplastic materials including polystyrene, acrylonitrile butadiene styrene, polyamide, polypropylene, polyethylene, acetal, and polyvinyl chloride or PVC. Polymers also include thermoset materials including epoxy and compounds thereof including fillers such as calcium carbonate. During the encapsulation process, the flowable material surrounds substrate 202 and portions of connectors 204, and flows around a mold to form shroud portion 230 in a single step, thus forming an inseparable single part comprising shroud portion 230 and body portion 210. By inseparable it is meant that shroud portion 230 and body portion 210 are joined in a firm and substantially permanent manner.

Figure 12:
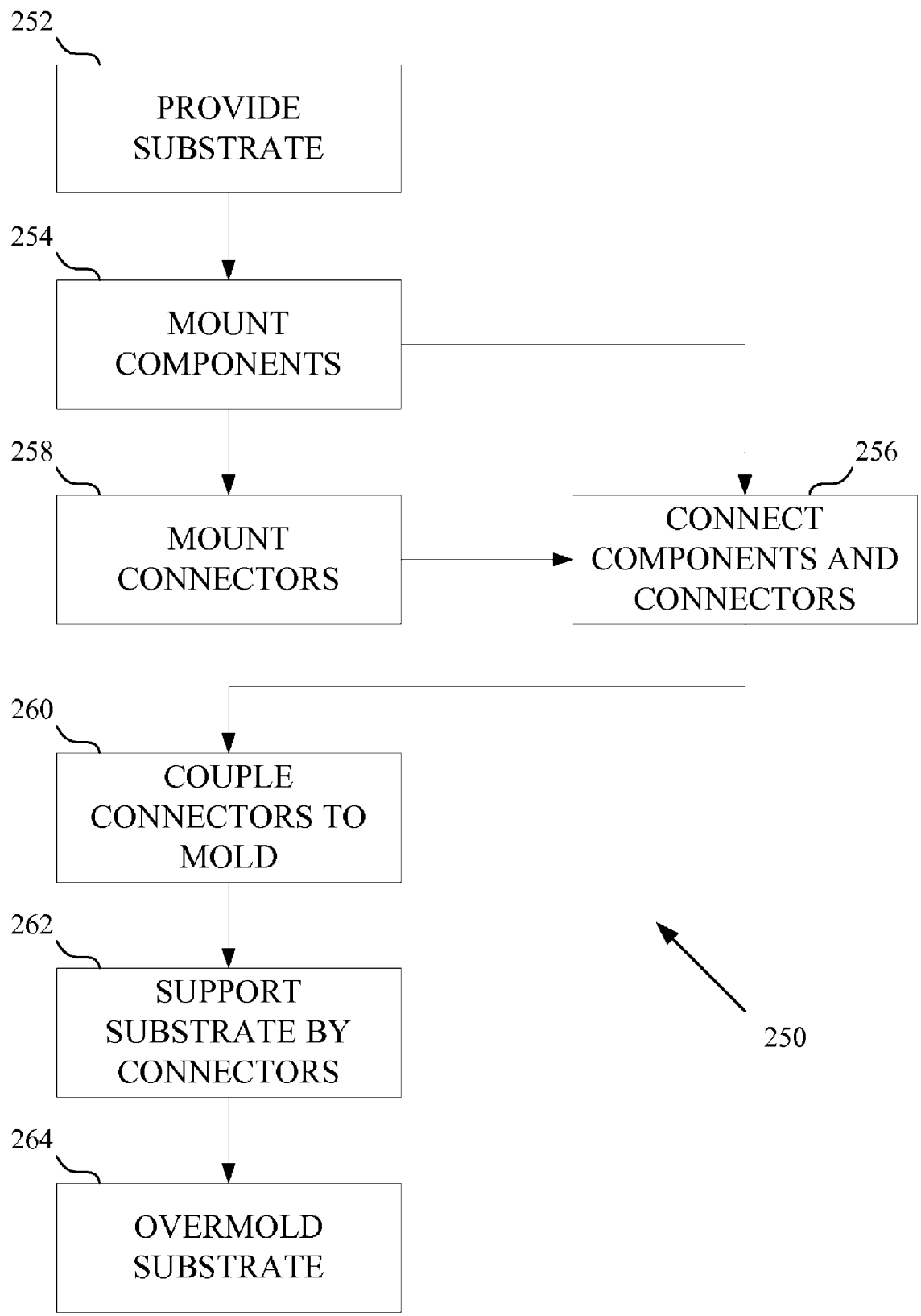
FIG. 12 is a block diagram of a method of making the electronic assembly of FIG. 10.

FIG. 12 depicts flowchart 250 illustrating a method of making assembly 200. The method starts at step 252 with the provision of a suitable substrate such as substrate 202. At step 254, components are mounted on the substrate. Components may comprise pins insertable in orifices disposed in the substrate or may be surface mounted and thermally or adhesively coupled to the substrate. Afterwards or concurrently, at step 258, a plurality of individual connectors are mounted by insertion into a plurality of orifices in the substrate. Each connector has two ends. One end is inserted into the substrate and, in a subsequent step, is encapsulated. The other end extends from the encapsulating flowable material into the female receptacle for connection to the an electrical system. Orifices may extend from one surface of the substrate and terminate intermediate the two opposite external surfaces of the substrate, or may also form a through-hole such that connectors may extend through to the opposite surface of the substrate. Connectors may be male or female. At step 256, components, and/or connectors, are connected to the substrate by any known method such as, for example, standing-wave soldering.

Once the substrate, connectors and components are mounted and connected to conductive traces on the substrate and to each other, the method proceeds to step 260. At step 260, connectors are coupled to a mold. Male connectors may be inserted into mold apertures. The mold may include protrusions that are inserted into female connectors. The mold may comprise two parts which may be pressed to ensure flowable material does not flow into the mold apertures. Coupling between connectors and the substrate must be structurally sufficient to enable the mold to support the substrate by the connectors. A support part may be adapted to hold the connectors, to be held by the mold, and to be removed and discarded after encapsulation. At step 264, a flowable material is provided in a fluid state to surround the substrate, components and, at least partially, the connectors. The flowable material flows around the substrate and the components to encapsulate them. The material encapsulates the end of the connectors inserted into the substrate. After the flowable material encapsulates the components and the substrate, it solidifies from a fluid to a solid state.

An inseparable assembly made according to the method depicted in flowchart 250 has a number of advantages. As previously stated, a fillet may be provided to enhance rigidity. Contemporaneous encapsulation and shroud construction from one material, albeit a composite material, limits stress lines and reduces the risk of moisture penetration which may result from exposure to extreme temperatures. By contemporaneous it is meant substantially at the same time, such that the flowable material is in a fluid state in the transition region between the body and shroud portions while both portions are formed, thereby fusing both portions into an inseparable part when the transition region material solidifies. In some embodiments, it may be possible that some solidification of the body portion occurs before the entire body portion is formed and before the shroud portion begins forming. Such embodiments are included within the disclosed embodiments if the transition between the two portions is fluid while the portions are formed even if each portion is partially solidified in regions other than the transition region.

Figure 13:
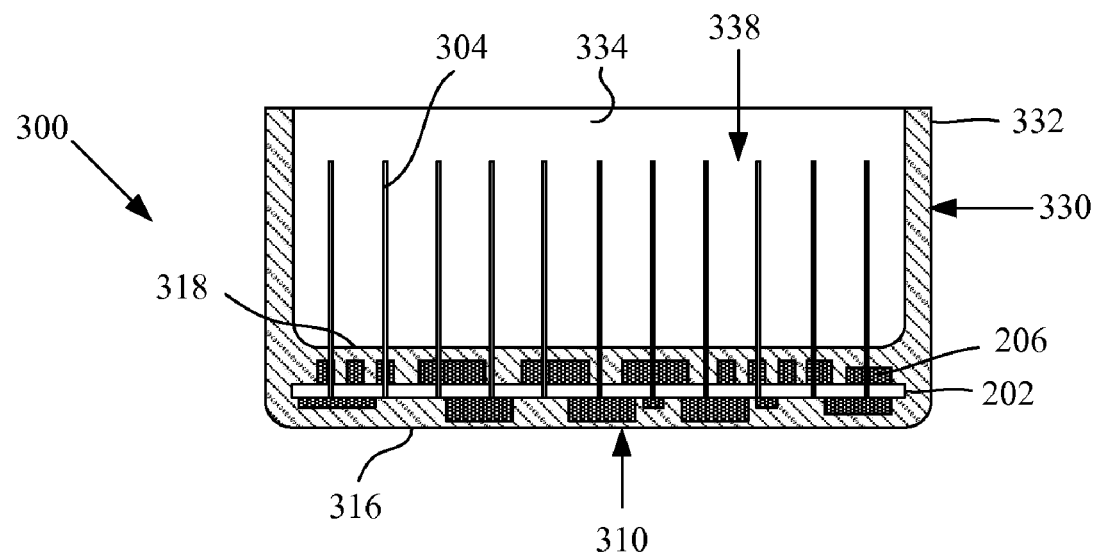
FIGS. 13-15 are cross section plan views of alternative embodiments of an electronic assembly.

FIG. 13 shows a cross-section of an alternative embodiment of a female assembly. The female assembly comprises body portion 310 having interior surface 318 spaced apart from second surface 316 and connected thereto by surface 332 which extends perpendicularly to surface 316 and forms an external wall of shroud portion 330. Surface 332 is spaced apart from surface 334 and, together with surface 334, define shroud portion 330. Assembly is substantially like assembly 200 except that body portion 310 does not extend laterally from shroud portion 330. Body portion 310 and shroud portion 330 comprise an encapsulating flowable material. Interior surface 318 has a plurality of orifices adapted to enable contact between pins from a connector plug to connectors, i.e. sockets, 304. Additionally, one or more protrusions may be provided extending from interior surface 334 to prevent insertion of an incompatible plug connector, or a compatible plug oriented incorrectly, into female receptacle 338 formed by shroud portion 330 and interior surface 318.

Figure 14:
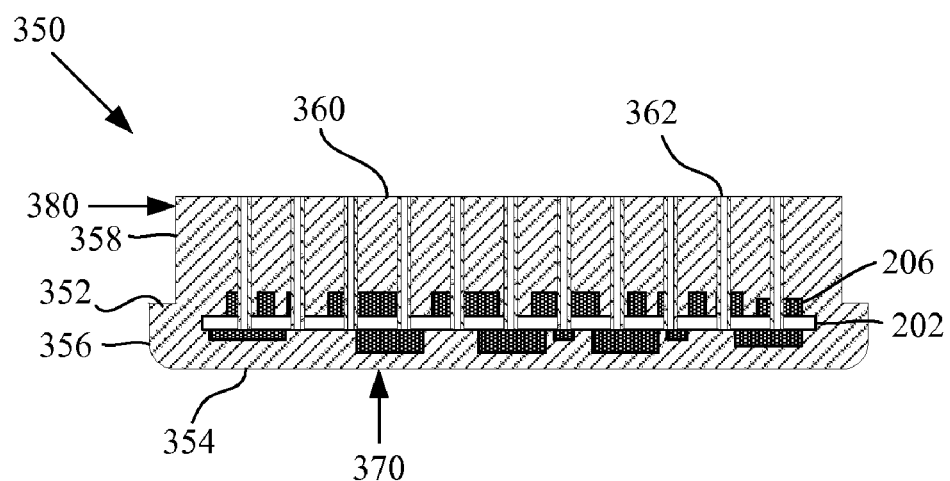

FIG. 14 shows assembly 350 illustrating a male, or plug, assembly. Assembly 350 comprises body portion 370 having first surface 352 spaced apart from second surface 354 and connected thereto by surface 358, and plug portion 380. Plug portion 380 is defined by external surface 358 and surface 360 which extend from, and is spaced apart from, respectively, first surface 352. Plug portion 380 has a plurality of orifices adapted to enable contact by external connectors with sockets 362.

Figure 15:
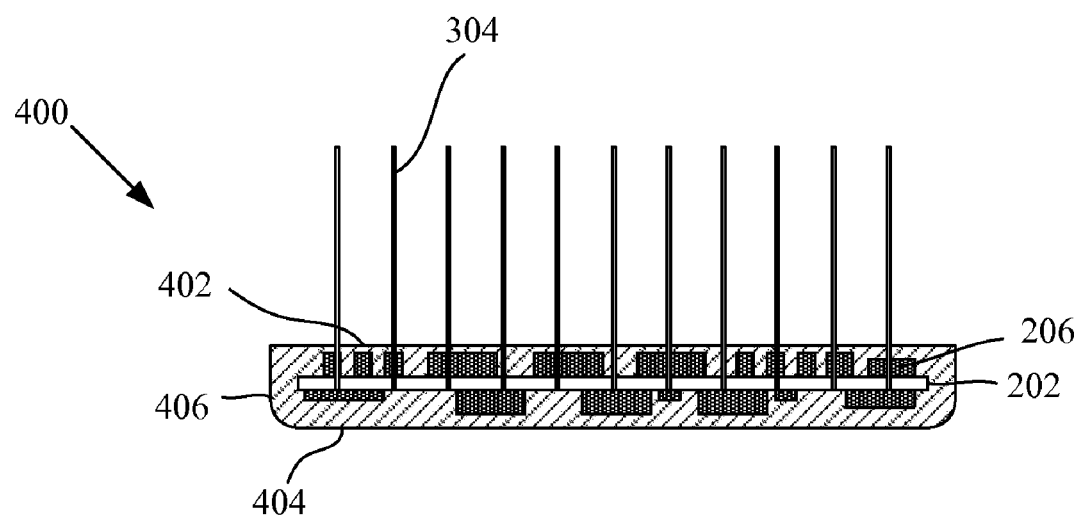

FIG. 15 shows assembly 400 illustrating an embodiment of a cap assembly. A flowable material encapsulates substrate 202 and components 206 forming surfaces 402 and 404 which are spaced apart by surface 406. Pins 304 are supported entirely by the flowable material and substrate 202.

While this disclosure has been described as having an exemplary design, the present disclosure may be further modified within the spirit and scope of this disclosure. This application is therefore intended to cover any variations, uses, or adaptations of the disclosure using its general principles. Further, this application is intended to cover such departures from the present disclosure as come within known or customary practice in the art to which this disclosure pertains.

The invention claimed is:

1. A method of integrating an addressable assembly in a vehicle comprising:
    providing a first control unit to control a function of the vehicle;
    providing an addressable assembly including:
        a substrate;
        a plurality of conductive traces disposed on the substrate;
        a plurality of connectors extending from a first surface of the substrate and being connected to the conductive traces, the connectors receiving a first plurality of signals including an identification address;
        a memory;
        a processing sequence stored in the memory;
        a second control unit operably coupled to the memory and to the conductive traces, the second control unit operable to produce a second plurality of signals responsive to the first plurality of signals according to the processing sequence;
        a housing enclosing the substrate and the second control unit; and
    electronically and removably coupling the addressable assembly to the first control unit, the first control unit performing the function responsive to the second plurality of signals.

2. The method of claim 1, wherein the housing comprises a flowable material which encapsulates the substrate and the second control unit, and wherein the substrate and the flowable material entirely supports the plurality of connectors.

3. The method of claim 2, wherein the flowable material is a polymeric composition.

4. The method of claim 3, wherein the polymeric composition is cross-linkable.

5. The method of claim 2, wherein the addressable assembly includes a shroud extending parallely to the connectors, the shroud being formed with the flowable material contemporaneously with the housing to form a single inseparable part.

6. The method of claim 2, wherein the addressable assembly includes a plug extending parallely to the connectors, the plug being formed with the flowable material contemporaneously with the housing to form a single inseparable part.

7. The method of claim 1, wherein the second control unit comprises an idle control unit.

8. The method of claim 1, further including the step of operably coupling the addressable assembly to a transducer, wherein the second plurality of signals is based on a signal generated by the transducer.

9. The method of claim 1, wherein the function comprises controlling operation of the engine while the vehicle is parked.

10. The method of claim 1, further including the steps of providing a harness and connecting the addressable assembly to the harness, wherein the harness provides an electronic path between the addressable assembly and the first control unit.

11. A method of using an addressable assembly in a vehicle, the vehicle including a communication network and a device, the method comprising:
    providing an addressable assembly including:
        a substrate having a plurality of conductive traces;
        a plurality of connectors extending from a first surface of the substrate and being connected to the conductive traces, the connectors receiving a first plurality of signals including an identification address;
        a memory;
        a processing sequence stored in the memory;
        a processing unit mounted on the substrate and connected to the conductive traces, the processing unit operable to produce a second plurality of signals according to the processing sequence based on the first plurality of signals;
        a housing comprising a flowable material which encloses the substrate and the processing unit, the housing and the substrate supporting the connectors;

electronically and removably coupling the addressable assembly to the communication network and to the device; and causing the device to perform a function based on the second plurality of signals.

12. The method of claim 11, wherein the flowable material encapsulates the substrate and the processing unit.

13. The method of claim 12, wherein the flowable material is a cross-linkable polymeric composition.

14. The method of claim 11, wherein the device is one of a heating and a cooling device, and the function comprises controlling an interior temperature of the vehicle by controlling operation of the device.

15. The method of claim 11, wherein the device is a power distribution switch, and the function comprises controlling power distribution when the vehicle idles.

16. The method of claim 11, wherein the addressable assembly includes a shroud extending parallely to the connectors, the shroud being formed with the flowable material contemporaneously with the housing to form a single inseparable part.

17. The method of claim 11, wherein the addressable assembly includes a plug extending parallely to the connectors, the plug being formed with the flowable material contemporaneously with the housing to form a single inseparable part.

18. The method of claim 11, wherein the communication network comprises a harness, and the addressable assembly is supported by the harness.

19. An addressable assembly adapted for coupling to a vehicle comprising:
a substrate having a plurality of conductive traces;
a plurality of connectors extending from a first surface of the substrate and being connected to the conductive traces, the connectors receiving a first plurality of signals including an identification address;
a memory;
a processing sequence stored in the memory;
a processing unit mounted on the substrate and connected to the conductive traces, the processing unit operable to produce a second plurality of signals according to the processing sequence based on the first plurality of signals; and
a housing comprising a flowable material which encloses the substrate and the processing unit, the housing and the substrate supporting the connectors.

20. The method of claim 19, wherein the flowable material encapsulates the substrate and the processing unit.

21. The method of claim 20, wherein the flowable material is a cross-linkable polymeric composition.

22. The method of claim 19, wherein the second plurality of signals is operable to control an interior temperature of the vehicle.

23. The method of claim 19, wherein addressable assembly is adapted to receive a transducer signal and to produce the second plurality of signals responsive to the transducer signal.

24. The method of claim 19, wherein the second plurality of signals is operable to control operation of an engine of the vehicle while the vehicle is parked.

25. The method of claim 19, wherein the addressable assembly includes a shroud extending parallely to the connectors, the shroud being formed with the flowable material contemporaneously with the housing to form a single inseparable part.

26. The method of claim 19, wherein the addressable assembly includes a plug extending parallely to the connectors, the plug being formed with the flowable material contemporaneously with the housing to form a single inseparable part.

27. The method of claim 19, wherein the addressable assembly is sized and configured for coupling to a harness and to be supported by the harness.

* * * * *